United States Patent
Shima

(10) Patent No.: US 7,435,656 B2
(45) Date of Patent: Oct. 14, 2008

(54) SEMICONDUCTOR DEVICE OF TRANSISTOR STRUCTURE HAVING STRAINED SEMICONDUCTOR LAYER

(75) Inventor: Masashi Shima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/147,203

(22) Filed: Jun. 8, 2005

(65) Prior Publication Data

US 2005/0230717 A1    Oct. 20, 2005

Related U.S. Application Data

(62) Division of application No. 10/643,883, filed on Aug. 20, 2003, now Pat. No. 6,930,374.

(30) Foreign Application Priority Data

Aug. 21, 2002  (JP) ............................. 2002-240168

(51) Int. Cl.
*H01L 21/336* (2006.01)
*H01L 21/76* (2006.01)

(52) U.S. Cl. ...................... 438/296; 438/360; 438/429; 257/E21.546

(58) Field of Classification Search ................. 438/429, 438/296, 360
See application file for complete search history.

(56) References Cited

U.S. PATENT DOCUMENTS

| 5,266,813 | A | * | 11/1993 | Comfort et al. | ................ 257/19 |
| 2004/0009636 | A1 | * | 1/2004 | Ichinose et al. | ............. 438/199 |
| 2004/0121554 | A1 | | 6/2004 | Ohnishi et al. | |

* cited by examiner

*Primary Examiner*—Lex Malsawma
(74) *Attorney, Agent, or Firm*—Westerman, Hattori, Daniels & Adrian, LLP.

(57) ABSTRACT

The semiconductor device comprises a p type Si substrate 10; a SiGe buffer layer 12 formed on the p type Si substrate 10 and having element isolation grooves 16 formed in the surface, which define an active region 18; a SiGe regrown buffer layer 20 formed on the SiGe buffer layer 12; a strained Si channel layer 22 formed on the side walls of the element isolation grooves 16 and on the SiGe regrown buffer layer 20 in the active region; a SiN film 24 formed on the strained Si channel layer 22 on the side walls of the element isolation grooves 16; and an element isolation insulation film 26 buried in the element isolation grooves.

17 Claims, 25 Drawing Sheets

SEMICONDUCTOR DEVICE OF TRANSISTOR STRUCTURE HAVING STRAINED SEMICONDUCTOR LAYER

This application is a divisional of prior application Ser. No. 10/643,883 filed on Aug. 20, 2003, now U.S. Pat. No. 6,930,374.

CROSS-REFERENCE TO RELATED APPLICATION

This application is based upon and claims priority of Japanese Patent Application No. 2002-240168, filed on Aug. 21, 2002, the contents being incorporated herein by reference.

BACKGROUND OF THE INVENTION

The present invention relates to a semiconductor device of a transistor structure having the semiconductor layer compression- or tension-strained, and a method for fabricating the semiconductor device.

Recently, electronic devices, such as transistors, etc., are required to make high-speed operations at low leak currents for high speed and low electric power consumption of information processing and data communication.

As one means for making a transistor speedy, the semiconductor layer to be the channel is compression- or tension-strained by stacking different materials is known. FIGS. 22 and 23 are sectional views of conventional transistor structures which are made speedy by compression- or tension-straining the semiconductor layer to be the channel.

FIG. 22 is a sectional view of a MOS transistor having a Si channel layer which is tension-strained, which shows the structure thereof.

A SiGe buffer layer 202 and a strained Si channel layer 204 are stacked on a p type Si substrate 200. Element isolation grooves 208 which are to be element isolation regions 206 are formed in the SiGe buffer layer 202 and the strained Si channel layer 204. The element isolation grooves 208 define an active region 210 where an element is to be formed.

An element isolation insulation film 212 of a silicon oxide film is buried in the element isolation grooves 208.

Source/drain diffused layers 214a, 214b are formed in the strained Si channel layer 204 and the SiGe buffer layer 202 in the active region 210. A gate electrode 218 is formed on the strained Si channel layer 204 between the source/drain diffused layers 214a, 214b, with the gate insulation film 216 of a silicon oxide film formed between the gate electrode 218 and the strained Si channel layer 204. Source/drain electrodes 220a, 220b are connected to the source/drain diffused layers 214a, 214b. The transistor is thus constituted with the gate electrode 218 and the source/drain diffused layers 214a, 214b formed in the active region 210.

FIG. 23 is a sectional view of a MOS transistor having the SiGe channel layer compression-strained, which shows the structure thereof.

A Si buffer layer 224, a strained SiGe channel layer 226 and a Si cap layer 228 are stacked on a p type Si substrate 222.

Element isolation grooves 232 to be element isolation regions 230 are formed in the Si buffer layer 224, the strained SiGe channel layer 226 and the Si cap layer 228. The element isolation grooves 232 define an active region 234 for an element to be formed in.

An element isolation insulation film 236 of a silicon oxide film is buried in the element isolation grooves 232.

Source/drain diffused layers 238a, 238b are formed in the Si cap layer 228 and the strained SiGe channel layer 226 in the active region 234. A gate electrode 242 is formed on the Si cap layer 228 between the source/drain diffused layers 238a, 238b, with a gate insulation film 240 of a silicon oxide film formed between the gate electrode 242 and the Si cap layer 228. Source/drain electrodes 244a, 244b are connected to the source/drain diffused layers 238a, 238b. The transistor is thus constituted with the gate electrode 242 and the source/drain diffused layers 238a, 238b formed in the active region 234.

It is reported that the above-described structures shown in FIGS. 22 and 23 improve mobility and drive current. However, in the structures shown in FIGS. 22 and 23, in which the element isolation is performed by STI (Shallow Trench Isolation), the element isolation insulation film of a silicon oxide film and the SiGe layer in the active region contact each other at the end of the element isolation regions 206, 230. As a result, as shown in the upper side view of FIG. 24, paths of leak current are formed along the ends of the element isolation regions 206, 230. Accordingly, the transistor has large OFF-state current, which disadvantageously increases electric power consumption of the device.

As a means for suppressing the generation of the leak current due to the contact between the element isolation insulation film of a silicon oxide film buried in the element isolation grooves and the SiGe layer, as exemplified in FIG. 25, the means of forming a layer of polysilicon on the side walls of the element isolation grooves is proposed. That is, sidewalls 246 of polysilicon are formed on the side walls of the element isolation grooves 232, covering the strained SiGe channel layer 226 exposed at the ends of the active region 234. The sidewalls 236 prohibit the contact between the strained SiGe channel layer 226 and the element isolation insulation film 236. However, in forming the sidewalls 236 by this means, the active region 234 is exposed to dry etching.

SUMMARY OF THE INVENTION

An object of the present invention is to provide a semiconductor device of a transistor structure having the semiconductor layer compression- or tension-strained, which can suppress the formation of the leak current paths along the ends of the active region and can operate at high speed and low electric power consumption, and a method for fabricating the semiconductor device.

According to one aspect of the present invention, there is provided a semiconductor device comprising: a silicon substrate; a SiGe layer formed on the silicon substrate and having an element isolation groove formed in the surface of the SiGe layer, which defines an active region; a silicon layer formed on the side wall of the element isolation groove and the SiGe layer in the active layer; and an element isolation insulation film buried in the element isolation groove with the silicon layer formed in.

According to another aspect of the present invention, there is provided a semiconductor device comprising: a silicon substrate having an element isolation groove defining an active region formed in the surface; a SiGe layer formed on the side wall of the element isolation groove and the active region in the silicon substrate; a silicon layer formed on the SiGe layer; and an element isolation insulation film buried in the element isolation groove with the silicon layer formed in.

According to further another aspect of the present invention, there is provided a method for fabricating a semiconductor device comprising the steps of: forming a SiGe layer on a silicon substrate; forming in the SiGe layer an element isolation groove for defining an active region; forming a silicon layer on the side wall of the element isolation groove and the SiGe layer in the active region; and burying an element isolation insulation film in the element isolation groove with the silicon layer formed in.

According to further another aspect of the present invention, there is provided a method for fabricating a semiconductor device comprising the steps of: forming in a silicon substrate an element isolation groove for defining an active region; forming a SiGe layer on the side wall of the element isolation groove and the active region in the silicon substrate; forming a silicon layer on the SiGe layer; and burying an element isolation insulation film in the element isolation groove with the silicon layer formed in.

As described above, the present invention comprises: a silicon substrate; a SiGe layer formed on the silicon substrate and having an element isolation groove formed in the surface, which define an active region; a silicon layer formed on the side wall of the element isolation groove and the SiGe layer in the active region; and an element isolation insulation film buried in the element isolation groove with the silicon layer formed in, whereby the contact between the SiGe layer in the active region and the element isolation insulation film is prevented, and accordingly the formation of the leak current paths along the ends of the active region can be suppressed.

The present invention comprises: a silicon substrate having an element isolation groove formed in the surface, which define an active region; a SiGe layer formed on the side wall of the element isolation groove and the active region in the silicon substrate; a silicon layer formed on the SiGe layer; and an element isolation insulation film buried in the element isolation groove with the silicon layer formed in, whereby the contact between the SiGe layer in the active region and the element isolation insulation film can be prevented, and accordingly, the formation of the leak current paths along the end of the active region can be suppressed.

The insulation film of SiN film or others formed on the strained silicon layer or the silicon layer formed on the side walls of the element isolation grooves can effectively suppress the formation of the leak current paths along the ends of the active region.

DETAILED DESCRIPTION OF THE INVENTION

A First Embodiment

Figure 1:
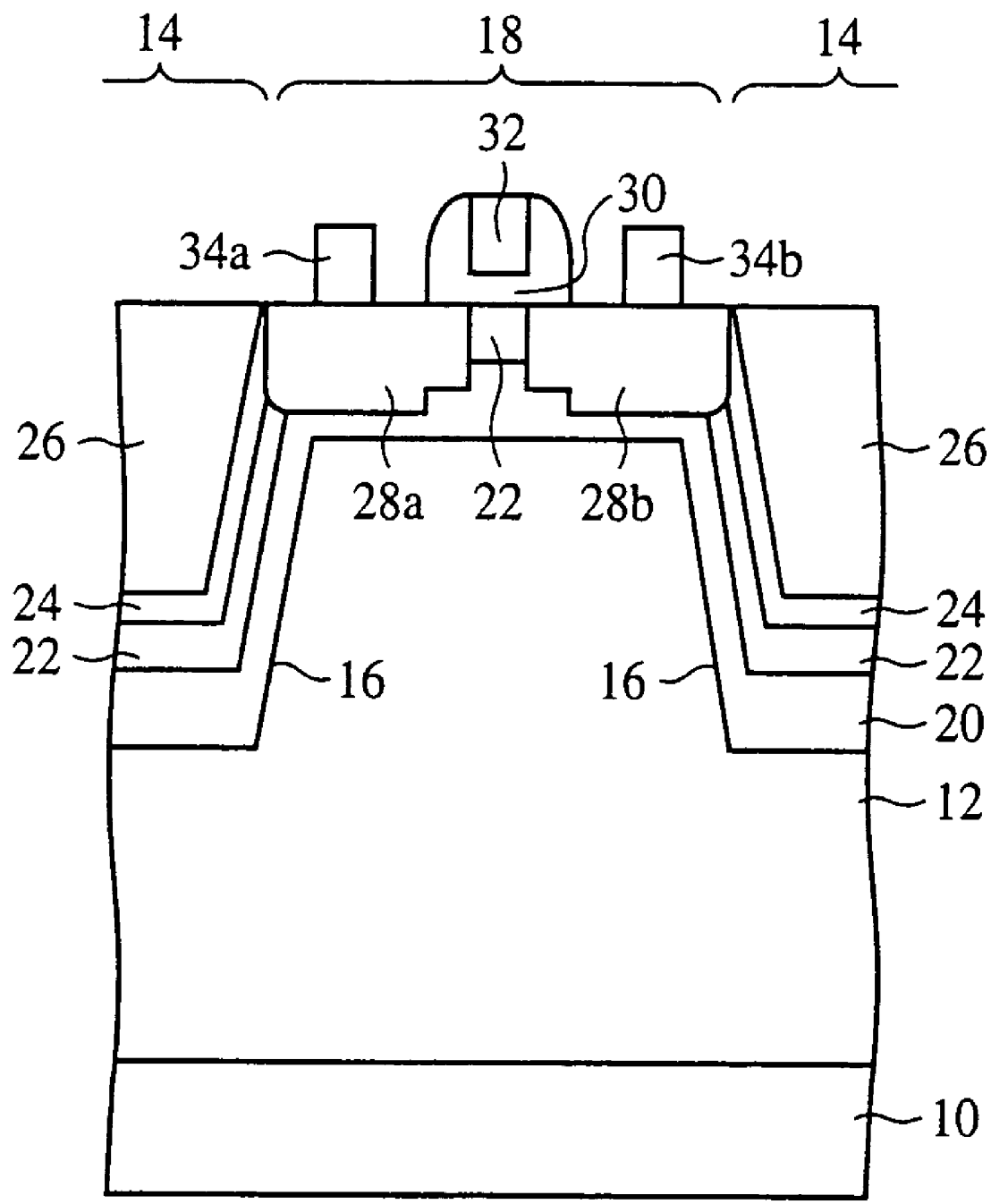
FIG. 1 is a sectional view of the semiconductor device according to a first embodiment of the present invention, which shows a structure thereof.

The semiconductor device according to a first embodiment of the present invention and the method for fabricating the semiconductor device will be explained with reference to FIGS. 1, 2A-2C, 3A-3C and 4A-4C. FIG. 1 is a sectional view of the semiconductor device according to the present embodiment, which shows a structure thereof. FIGS. 2A-2C, 3A-3C and 4A-4C are sectional views of the semiconductor device according to the present embodiment in the steps of the method for fabricating the semiconductor device, which explain the method.

First, the semiconductor device according to the present embodiment will be explained with reference to FIG. 1. The semiconductor device according to the present embodiment is a p type MOS transistor having a tension-strained n type Si channel layer.

A SiGe buffer layer 12 is formed on a p type Si substrate 10 doped with boron. Element isolation grooves 16 which are to be element isolation regions 14 are formed in the SiGe buffer layer 12. The element isolation grooves 16 define an active region 18 for an element to be formed in. A composition of the SiGe is, e.g., 80% of Si and 20% of Ge.

On the SiGe buffer layer 12 with the element isolation grooves 16 formed in, a SiGe regrown buffer layer 20 and an n type strained Si channel layer 22 are stacked in the stated order.

A SiN film 24 is formed on the strained Si channel layer 22 formed on the side walls and the bottom surfaces of the element isolation grooves 16. An element isolation insulation film 26 of a silicon oxide film is buried in the element isolation grooves 16 with the SiN film 24 formed in.

Source/drain diffused layers 28a, 28b are formed on the strained Si channel layer 22 and the SiGe regrown buffer layer 20 in the active region 18. A gate electrode 32 is formed on the strained Si channel layer 22 between the source/drain diffused layers 18a, 18b with a gate insulation film 30 of a silicon oxide film formed between the Si channel layer 22 and the gate electrode 32. Source/drain electrodes 34a, 34b are electrically connected to the source/drain diffused layers 28a, 28b. The transistor having the gate electrode 32, the source/drain diffused layers 28a, 28b in the active region 18 is thus constituted.

The semiconductor device according to the present embodiment is characterized mainly by a transistor structure having the strained semiconductor layer to be a channel layer, in which the strained Si channel layer 22 and the SiN film 24 are disposed between the SiGe layer and the element isolation insulation film 26 at the ends of the active region 18. The strained Si channel layer 22 and the SiN film 24 prohibit the contact between the SiGe layer and the element isolation insulation film 26 of a silicon oxide film, whereby the contact between the SiGe layer and the silicon oxide film is prohibited, and accordingly, the formation of the leak current paths along the ends of the active layer 18 can be suppressed. Resultantly, the MOS transistor can have low electric power consumption and high-speed operation.

Next, the method for fabricating the semiconductor device according to the present embodiment will be explained with reference to FIGS. 2A-2C, 3A-3C and 4A-4C. In the method for fabricating the semiconductor device according to the present embodiment, the element isolation is performed by STI.

The SiGe buffer layer 12 of a 2 μm-thickness and the Si cap layer 35 of a 5 nm-thickness are stacked sequentially on the p type Si substrate 10 doped with about $1 \times 10^{16}/cm^3$ boron by, e.g., MOCVD. The Si cap layer 35 here formed is to be a silicon oxide film as the base for forming the SiN film as a mask film by thermal oxidation in the next step.

Next, the surface of the p type Si substrate 10 with the SiGe buffer layer 12 and the Si cap layer 35 formed on is oxidized by, e.g., thermal oxidation. Thus, the silicon oxide film 36 is formed on the surface of the Si cap layer 35. This thermal oxidation lowers a level in the interface because the contact between the thermal oxide film and Si is closer than that between the buried oxide film and Si. At this time, the Si cap layer 35 on the SiGe buffer layer 12 keeps the SiGe buffer layer 12 from being directly oxidized, whereby, in forming the strained Si channel layer 22 in a later step, crystal morphology is better than that without the Si cap layer formed. The grown strained Si channel layer 22 can have better crystal quality, and can have high mobility.

Figure 2A:
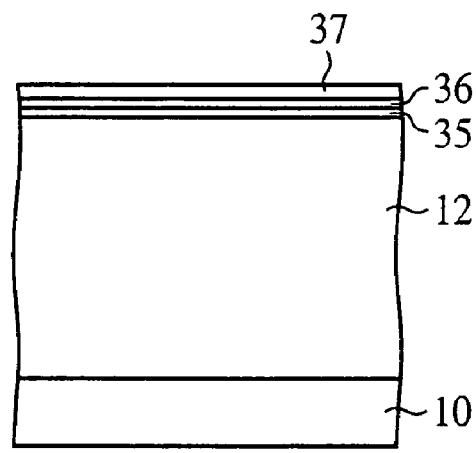
FIGS. 2A-2C are sectional views of the semiconductor device according to the first embodiment of the present invention in the steps of the method for fabricating the semiconductor device, which shows the method (Part 1).

The SiN film 37 of a 100 nm-thickness is formed by, e.g., CVD (Chemical Vapor Deposition) on the silicon oxide film 36 formed on the surface of the Si cap layer 35 by the oxidation (see FIG. 2A).

Then, the SiN film 37 is patterned by lithography and etching to leave the SiN film 37 in a region to be the active region 18.

Figure 2B:
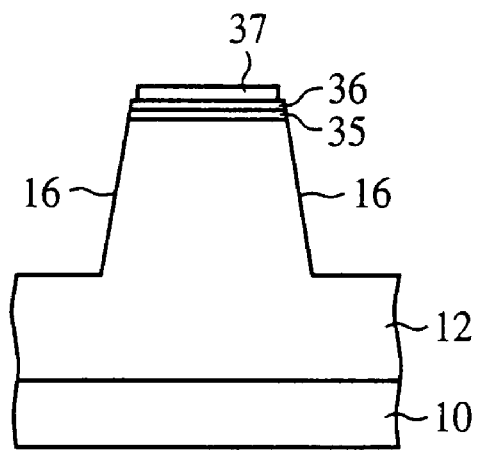

Then, with the patterned SiN film 37 as a mask, the SiGe buffer layer 12 is etched by, e.g., RIE (Reactive Ion Etching) to form the element isolation grooves 16 (see FIG. 2B).

After the element isolation grooves 16 have been formed, the SiN film 37 used as the mask is etched off. Then, the silicon oxide film 36 is removed with hydrofluoric acid or others. The Si cap layer 35 may be left. In the drawings following FIG. 2C, the Si cap layer 35 is omitted.

Figure 2C:
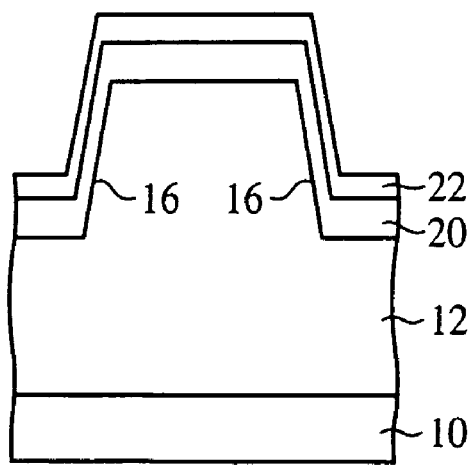

Then, the SiGe regrown buffer layer 20 of a 10 nm-thickness and the n type strained Si channel layer 22 of a 10 nm-thickness are sequentially stacked by, e.g., MOCVD on the entire surface of the SiGe buffer layer 12 with the element isolation grooves 16 formed in (see FIG. 2C).

Next, the strained Si channel layer 22 is thermally oxidized to form a thermal oxide film on the surface of the strained Si channel layer 22. This thermal oxide film can improve close-tightness of a SiN film to be formed in the next step. It is necessary to consider a film thickness of the strained Si channel layer 22 which is formed in advance, and conditions, etc. for the thermal oxidation so that all the strained channel layer 22 is not consumed for forming the thermal oxide film.

Then, the SiN film 24 as a stopper film for the polishing is formed on the entire surface by, e.g., MOCVD.

Figure 3A:
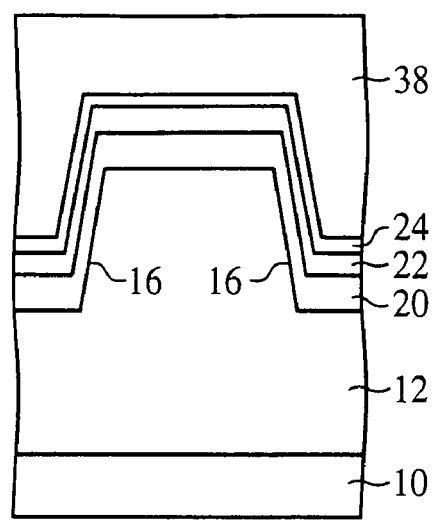
FIGS. 3A-3C are sectional views of the semiconductor device according to the first embodiment of the present invention in the steps of the method for fabricating the semiconductor device, which shows the method (Part 2).

Next, the silicon oxide film 38 is formed on the entire surface by, e.g., CVD to fill the element isolation grooves 16 with the silicon oxide film 38 (see FIG. 3A).

Then, the silicon oxide film 38 is polished by, e.g., CMP (Chemical Mechanical Polishing) down to the SiN film 24 as the stopper to be made flat. Thus, the element isolation grooves 16 are buried with the element isolation insulation film 26 of the silicon oxide film 38.

Figure 3B:
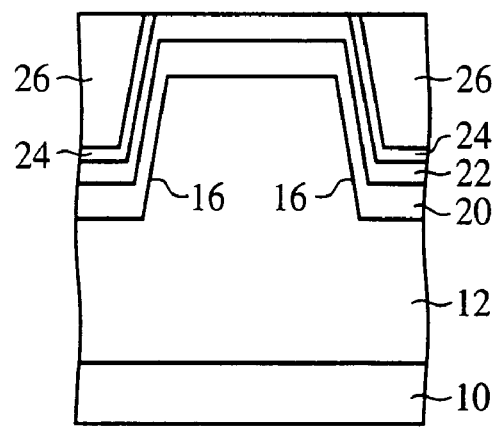
Figure 3C:
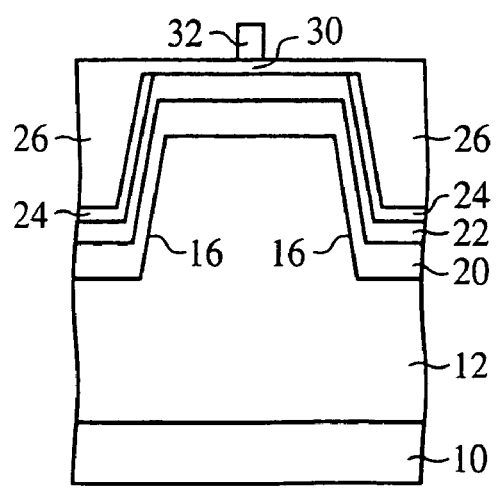

Then, the exposed SiN film 24 is removed by, e.g., thermal phosphatization (see FIG. 3B). At this time, the SiN film 24 between the strained Si channel layer 22 at the edges of the active region 18 and the element isolation insulation film 26 is not removed because the hot phosphoric acid does not enter there.

Then, the gate insulation film 30 of a 2 nm-thickness silicon oxide film is formed on the entire surface by, e.g., thermal oxidation.

Next, a polysilicon film is formed by, e.g., CVD. Then, the polysilicon film is patterned to form the gate electrode 32 in the active region 18 (see FIG. 3C).

Figure 4A:
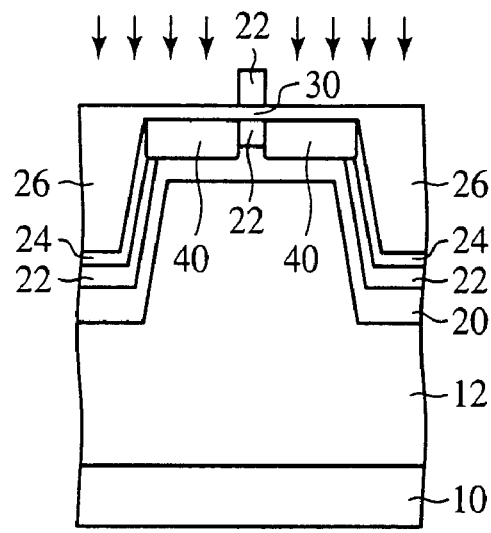
FIGS. 4A-4C are sectional views of the semiconductor device according to the first embodiment of the present invention in the steps of the method for fabricating the semiconductor device, which shows the method (Part 3).

Next, with the gate electrode 32 as a mask, boron for example, is ion-implanted to form parasitic regions 40 in the strained Si channel layer 22 on both sides of the gate electrode 32 (see FIG. 4A).

Then, a silicon oxide film is formed on the entire surface by, e.g., CVD, and then the silicon oxide film is etched to form a sidewall 42 on the gate electrode 32.

Figure 4B:
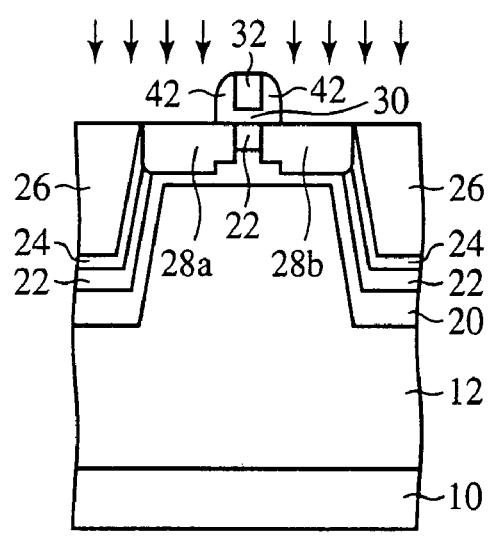

Next, boron, for example, is ion-implanted to form heavily doped regions in the source/drain and the gate (see FIG. 4B). After the ion implantation is completed, annealing is performed to activate the ions. Thus the source/drain diffused layers 28a, 28b are formed.

Figure 4C:
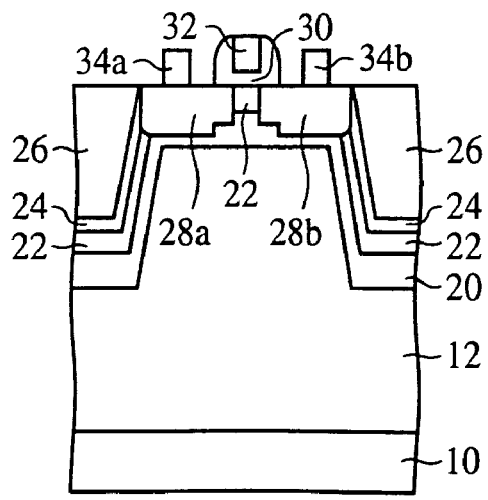

Next, the source/drain electrodes 34a, 34b are formed electrically connected to the source/drain diffused layers 28a, 28b (see FIG. 4C).

Thus, the semiconductor device according to the present embodiment is fabricated.

As described above, according to the present embodiment, the strained Si channel layer 22 and the SiN film 24 prevent the contact between the SiGe layer in the active region 18 and the element isolation insulation film 26 of silicon oxide film, whereby the formation of the leak current paths along the edges of the active region 18 can be suppressed. Thus, the MOS transistor of low electric power consumption and high operational speed can be provided.

The MOS transistor can be fabricated without adding fabrication steps, as of exposure, etc. even in comparison with the conventional MOS transistors.

A Second Embodiment

Figure 5:
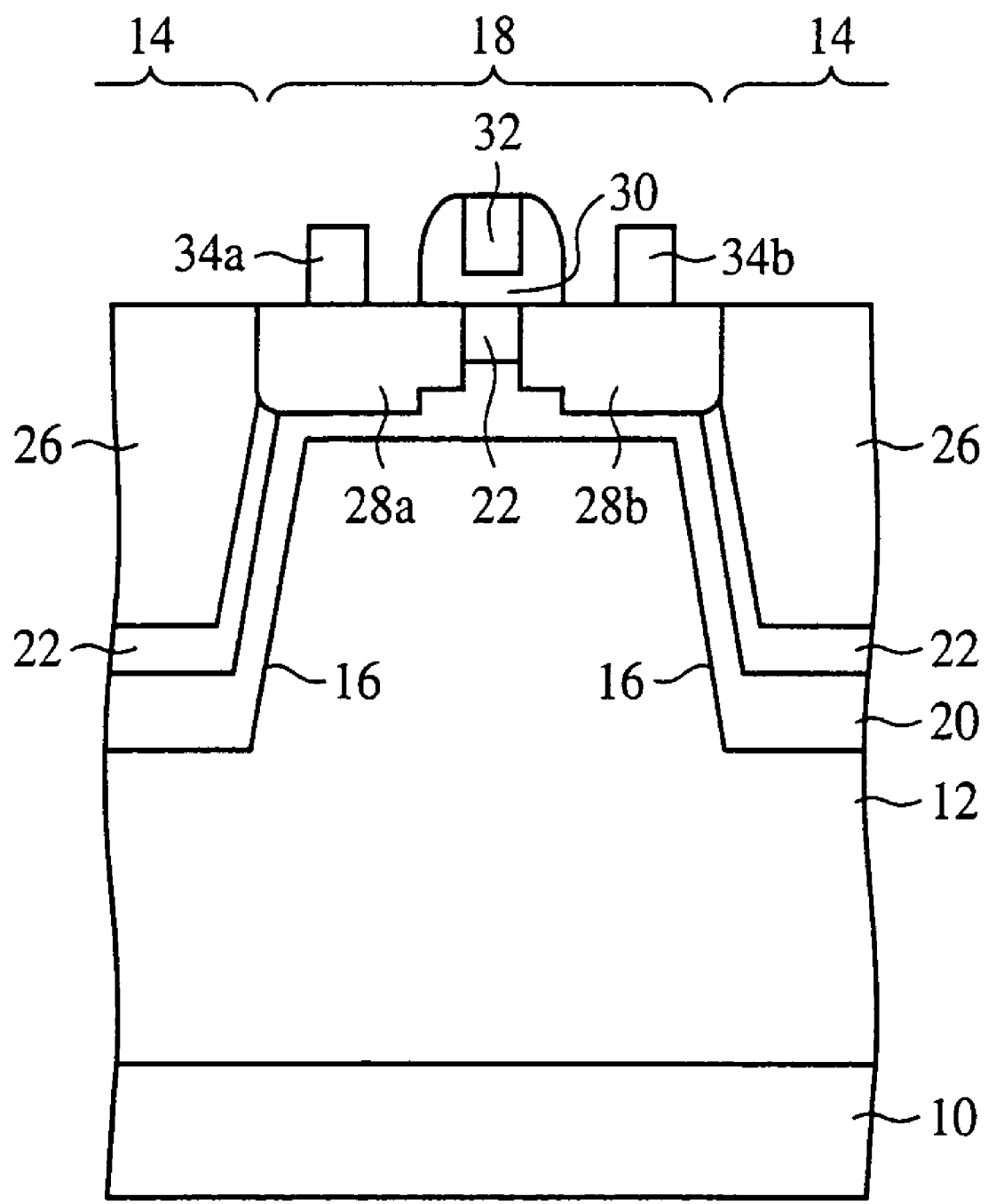
FIG. 5 is a sectional view of the semiconductor device according to a second embodiment of the present invention, which shows a structure thereof.
Figure 6A:
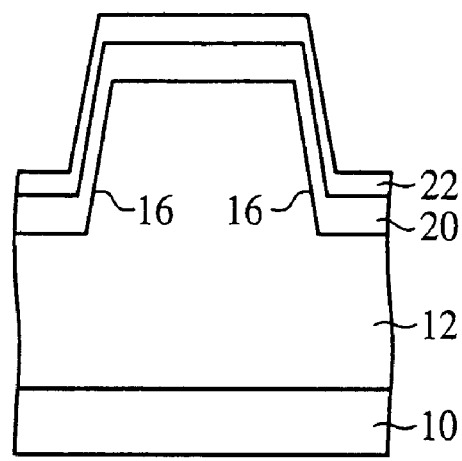
FIGS. 6A-6C are sectional views of the semiconductor device according to the second embodiment of the present invention in the steps of the method for fabricating the semiconductor device, which shows the method.
Figure 6B:
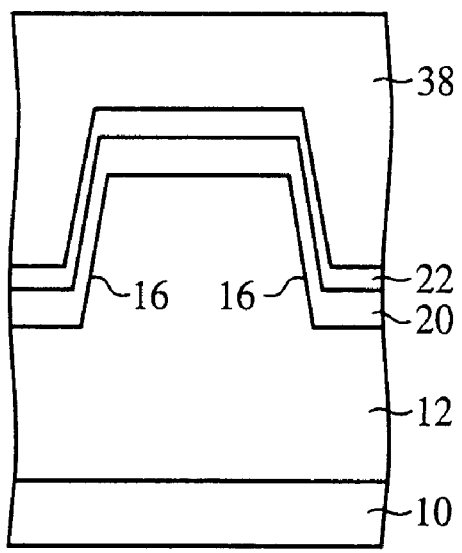
Figure 6C:
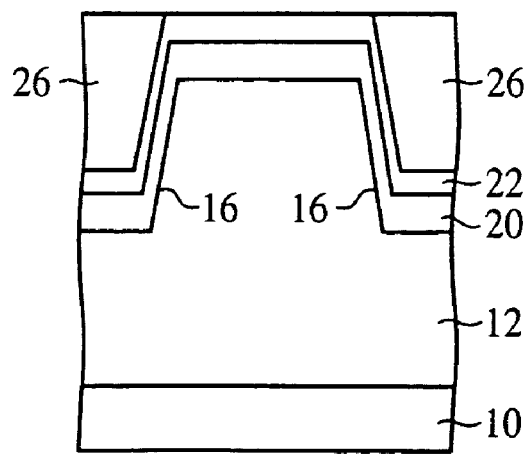

The semiconductor device according to a second embodiment of the present invention and the method for fabricating the semiconductor device will be explained with reference to FIGS. 5 and 6A-6C. FIG. 5 is a sectional view of the semiconductor device according to the present embodiment, which shows the structure thereof. FIGS. 6A-6C are sectional views of the semiconductor device according to the present embodiment in the steps of the method for fabricating the semiconductor device, which show the method. The same members of the present embodiment as those of the semiconductor device according to the first embodiment and the method for fabricating the semiconductor device are represented by the same reference numbers not to repeat or to simplify their explanation.

In the first embodiment, the SiN film 24 is disposed between the SiGe layer and the element isolation insulation film 26 in the active region 18. However, the SiN film 24 is not essentially formed. The semiconductor device according to the present embodiment is the semiconductor device according to the first embodiment which does not include the SiN film 24.

As shown in FIG. 5, in the semiconductor device according o the present embodiment, an element isolation insulation film 26 is buried directly in element isolation grooves 16 with a strained Si channel layer 22 formed on the side walls and the bottom surfaces.

Even with the SiN film 24 of the first embodiment not formed, the strained Si channel layer 22 can prevent the contact between the SiGe layer in the active region 18 and the element isolation insulation film 26. Thus, the formation of the leak current paths along the edges of the active region 18 can be suppressed.

Next, the method for fabricating the semiconductor device according to the present embodiment will be explained with reference to FIGS. 6A-6C.

In the same way as in the first embodiment, an SiGe regrown buffer layer 20 and the strained Si channel layer 22 are sequentially stacked on the entire surface of an SiGe buffer layer 12 with the element isolation grooves 16 formed in (see FIG. 6A).

Next, a silicon oxide film 38 is formed on the entire surface by, e.g., CVD to fill the element isolation grooves 16 with the silicon oxide film 38 (see FIG. 6B).

Then, the silicon oxide film 38 is polished by, e.g., CMP until the strained Si channel layer 22 in the active region 18 defined by the element isolation grooves 16 is exposed to thereby be made flat. Thus, the element isolation grooves 16 are filled with the element isolation insulation film 26 of the silicon oxide film 38 (see FIG. 6C).

Then, in the same way as in the first embodiment, a gate electrode 32, a source/drain diffused layers 28a, 28b, etc. are formed.

Thus, the semiconductor device according to the present embodiment shown in FIG. 5 is fabricated.

A Third Embodiment

Figure 7:
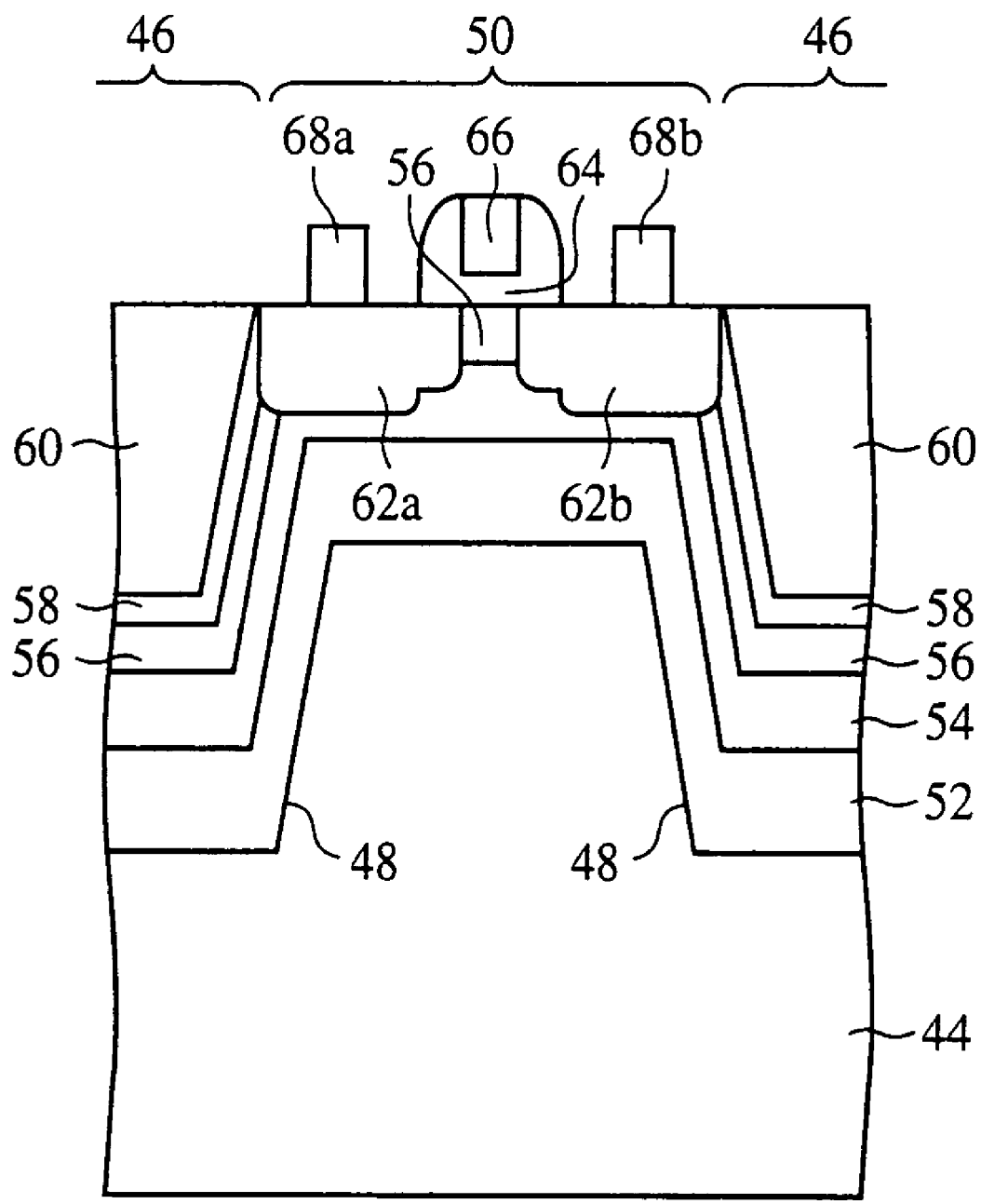
FIG. 7 is a sectional view of the semiconductor device according to a third embodiment of the present invention, which shows a structure thereof.

The semiconductor device according to a third embodiment of the present invention and the method for fabricating the semiconductor device will be explained with reference to FIGS. 7 to 10. FIG. 7 is a sectional view of the semiconductor device according to the present embodiment, which shows a structure thereof. FIGS. 8A-8C, 9A-9C and 10A-10C are sectional views of the semiconductor device according to the present embodiment in the steps of the method for fabricating the semiconductor device, which show the method.

First, the semiconductor device according to the present embodiment will be explained with reference to FIG. 7. The semiconductor device according to the present embodiment is a p type MOS transistor including an n type strained SiGe channel layer which is compression strained.

Element isolation grooves 48 to be element isolation regions 46 are formed in a boron-doped p type Si substrate 44, and the element isolation grooves 48 define an active region 50 when an element is to be formed.

A Si regrown buffer layer 52, a strained SiGe channel layer 54 and an Si cap layer 56 are sequentially stacked on the p type Si substrate 44 with the element isolation grooves 48 formed in.

A SiN film 58 is formed on the Si cap layer 56 formed on the side walls and the bottom surfaces of the element isolation grooves 48. An element isolation insulation film 60 of a silicon oxide film is buried in the element isolation grooves 48 with the SiN film 58 formed in.

Source/drain diffused layers 62a, 62b are formed in the Si cap layer 56 and the strained SiGe channel layer 54 in the active region 50. A gate electrode 66 is formed on the Si cap layer 56 between the source/drain diffused layers 62a, 62b with a gate insulation film 64 of a silicon oxide film formed between the gate electrode 66 and the Si cap layer 56. Source/drain electrodes 68a, 68b are electrically connected to the source/drain diffused layer 62a, 62b. Thus, a transistor having the gate electrode 66 and the source/drain diffused layers 62a, 62b in the active region 50 is constituted.

The semiconductor device according to the present embodiment is characterized mainly in that the Si cap layer 56 and the SiN layer 58 are disposed between the SiGe layer and the element isolation insulation film 60 at the edges of the active region 50 of the transistor structure. The Si cap layer 56 and the SiN film 58 prevent the contact between the SiGe layer and the element isolation insulation film 60 of silicon oxide film, whereby the formation of the leak current paths along the edges of the active region 50 can be suppressed. Thus, the MOS transistor can have low electric power consumption and high operational speed.

Next, the method for fabricating the semiconductor device will be explained with reference to FIGS. 8A-8C, 9A-9C and 10A-10C.

First, the surface of the p type Si substrate 44 doped with about $1 \times 10^{16}/cm^3$ of boron is oxidized.

Figure 8A:
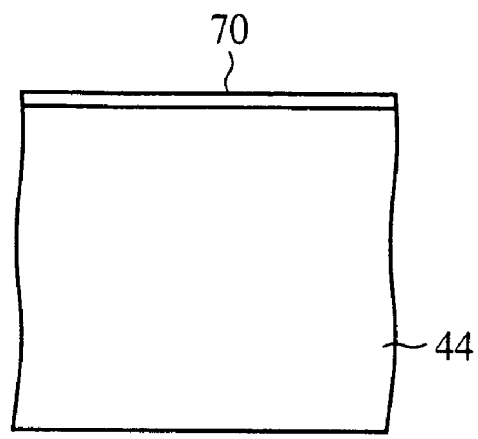
FIGS. 8A-8C are sectional views of the semiconductor device according to the third embodiment of the present invention in the steps of the method for fabricating the semiconductor device, which shows the method (Part 1).

Then, a 100 nm-thickness SiN film 70 is formed by, e.g., CVD on the p type Si substrate 44 having the surface oxidized (see FIG. 8A).

Next, the SiN film 70 is patterned by lithography and etching to leave the SiN film in a region to be the active region 50.

Figure 8B:
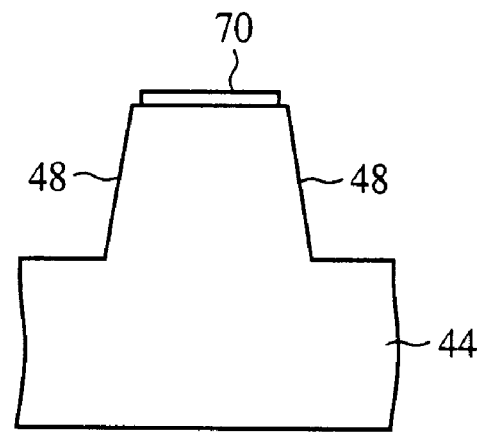
Figure 8C:
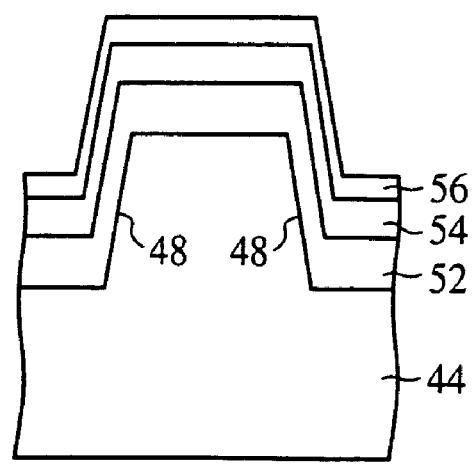

Then, with the patterned SiN film 70 as a mask, the p type Si substrate 44 is etched by, e.g., RIE to form the element isolation grooves 48 (see FIG. 8B).

After the element isolation grooves 48 have been formed, the SiN film 70 used as the mask is etched off.

Then, the Si regrown buffer layer 52 of a 10 nm-thickness, the n type strained SiGe channel layer 54 of a 10 nm-thickness and the Si cap layer 56 of a 10 nm-thickness are sequentially stacked by, e.g., MOCVD on the entire surface of the p type Si substrate with the element isolation grooves 48 formed in.

Then, the SiN film 58 to be used as a stopper film for the polishing is formed on the entire surface by, e.g., MOCVD. As in the first embodiment, before the SiN film 58 is formed, the Si cap layer 56 is thermally oxidized to form a thermal oxide film on the surface of the Si cap layer 56 for higher tight closeness with respect to the SiN film 58.

Figure 9A:
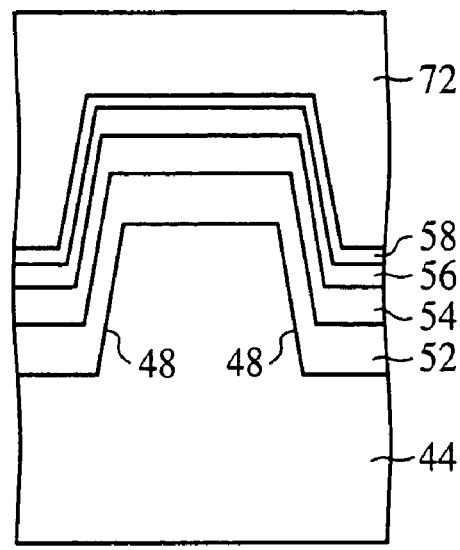
FIGS. 9A-9C are sectional views of the semiconductor device according to the third embodiment of the present invention in the steps of the method for fabricating the semiconductor device, which shows the method (Part 2).

Then, the silicon oxide film 72 is formed on the entire surface by, e.g., CVD to fill the element isolation grooves 48 with the silicon oxide film 72 (see FIG. 9A).

Next, the silicon oxide film 72 is polished by, e.g., CMP down to the SiN film 58 as the stopper film to be made flat. Thus, the element isolation grooves 48 are filled with the element insulation film 60 of the silicon oxide film 72.

Figure 9B:
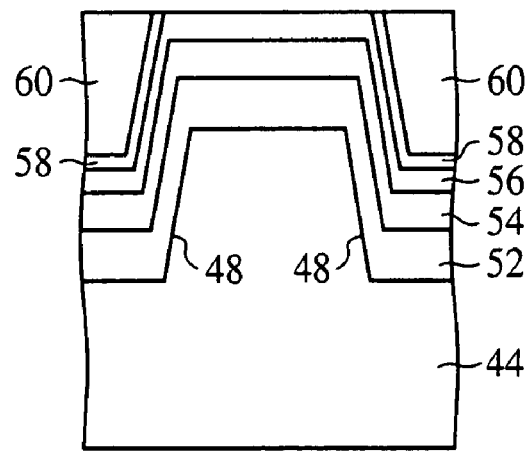
Figure 9C:
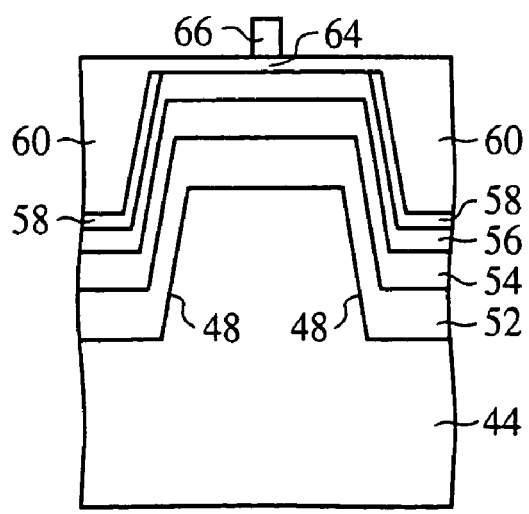

Then, the exposed SiN film 58 is removed by, e.g., thermal phosphatization (see FIG. 9B). At this time, the SiN film 58 between the Si cap layer 56 at the edges of the active region 50 and the element isolation insulation film 60 is not removed because the hot phosphoric acid does not enter there, as in the first embodiment.

Then, the gate insulation film 64 of a 2 nm-thickness silicon oxide film is formed on the entire surface by, e.g., thermal oxidation.

Then, a polysilicon film is formed by, e.g., CVD. Then, the polysilicon film is patterned to form the gate electrode 66 (see FIG. 9C).

Figure 10A:
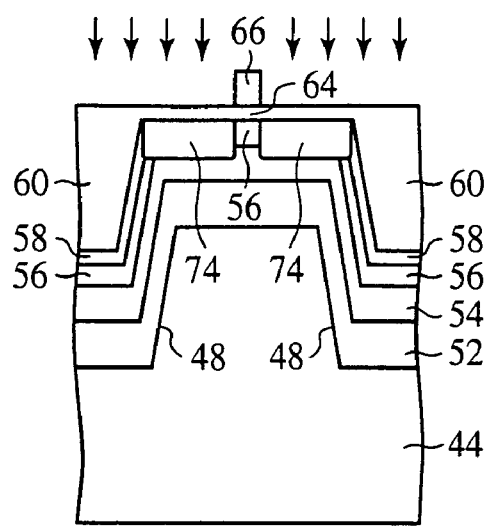
FIGS. 10A-10C are sectional views of the semiconductor device according to the third embodiment of the present invention in the steps of the method for fabricating the semiconductor device, which shows the method (Part 3).

Next, with the gate electrode 66 as a mask, boron, for example is ion-implanted to form a parasitic region 74 in the strained Si channel layer 22 on both sides of the gate electrode 66 (see FIG. 10A).

Then, a silicon oxide film is formed on the entire surface by, e.g., CVD, and then the formed silicon oxide film is etched to form the sidewall 76 on the gate electrode 66.

Figure 10B:
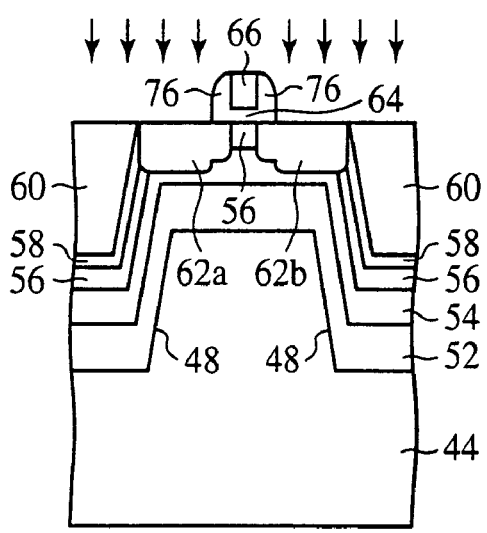

Next, to form the heavily doped regions in the source/drain and the gate, boron, for example, is ion-implanted (see FIG. 10B). After the ion implantation is completed, annealing is performed to activate the ions. Thus, the source/drain diffused layers 62a, 62b are formed.

Figure 10C:
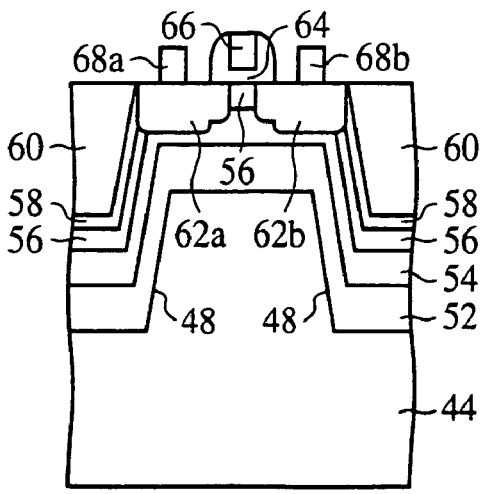

Next, the source/drain electrodes 68a, 68b are formed, electrically connected to the source/drain diffused layers 62a, 62b (see FIG. 10C).

Thus, the semiconductor device according to the present embodiment shown in FIG. 7 is fabricated.

As described above, according to the present embodiment, the Si cap layer 56 and the SiN film 58 prevent the contact between the SiGe layer in the active region 50 and the element isolation insulation film 60 of silicon oxide film, whereby the formation of the leak current paths along the edges of the active region 50 can be suppressed. Accordingly, the MOS transistor of low electric power consumption and high operational speed can be fabricated.

As in the first embodiment, the MOS transistor can be fabricated without adding fabrication steps, as of exposure, etc. even in comparison with the conventional MOS transistors.

A Fourth Embodiment

Figure 11:
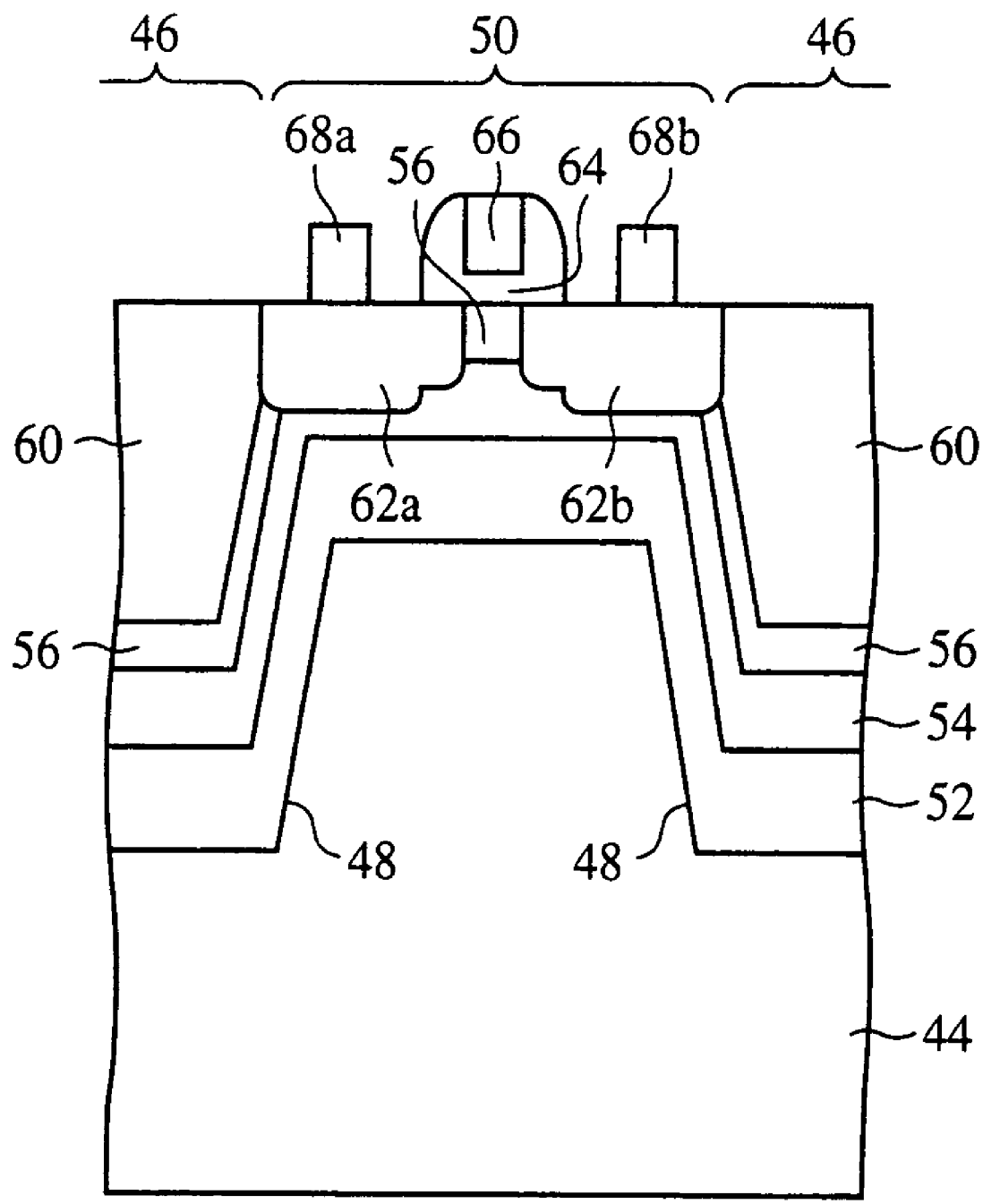
FIG. 11 is a sectional view of the semiconductor device according to a fourth embodiment of the present invention, which shows a structure thereof.
Figure 12A:
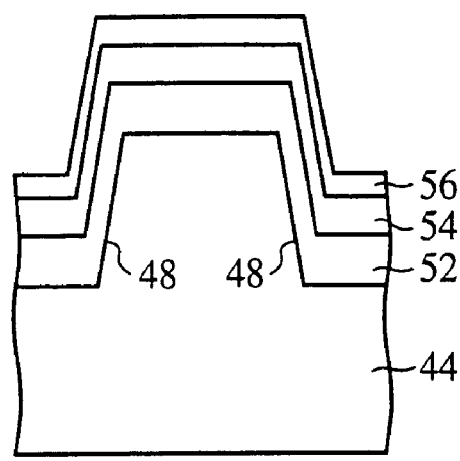
FIGS. 12A-12C are sectional views of the semiconductor device according to the fourth embodiment of the present invention in the steps of the method for fabricating the semiconductor device, which shows the method.
Figure 12B:
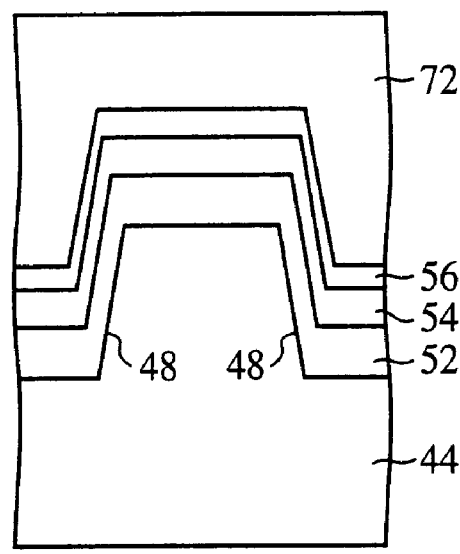
Figure 12C:
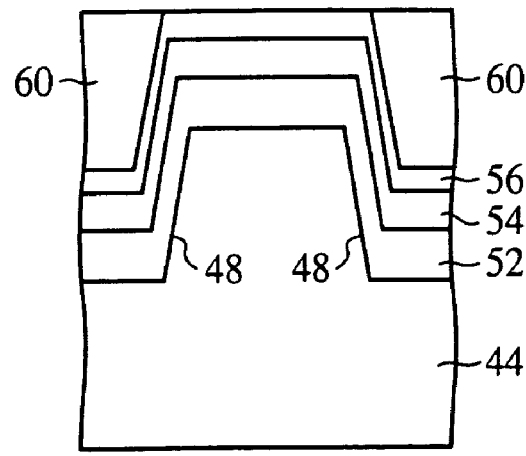

The semiconductor device according to a fourth embodiment of the present invention and the method for fabricating the semiconductor device will be explained with reference to FIGS. 11 and 12A-12C. FIG. 11 is a sectional view of the semiconductor device according to the present embodiment, which shows a structure thereof. FIGS. 12A-12C are sectional views of the semiconductor device according to the present embodiment in the steps of the method for fabricating the semiconductor device, which show the method. The same members of the present embodiment as those of the semiconductor device according to the third embodiment and the method for fabricating the semiconductor device are represented by the same reference numbers not to repeat or to simplify their explanation.

In the third embodiment, the SiN film 58 is disposed between the SiGe layer in the active region 50 and the element isolation insulation film 60, but the SiN film 58 is not essentially formed, as is not the SiN film 24 of the first embodiment. The semiconductor device according to the present embodiment is the semiconductor device according to the third embodiment which does not include the SiN film 58.

As shown in FIG. 11, in the present embodiment, the element isolation insulation film 60 is buried directly in element isolation grooves 48 with a Si cap layer 56 formed on the side walls and the bottom surfaces.

Thus, even without the SiN film 58 of the third embodiment, the Si cap layer 56 can prevent the contact between the SiGe layer in the acdtive region 50 and the element isolation insulation film 60. Accordingly, the formation of the leak current paths along the edges of the active region 50 can be suppressed.

Next, the method for fabricating the semiconductor device according to the present embodiment will be explained with reference to FIGS. 12A-12C.

First, in the same way as in the third embodiment, an Si regrown buffer layer 52, a strained SiGe channel layer 54 and an Si cap layer 56 are sequentially stacked on the entire surface of a p type Si substrate 44 with the element isolation grooves 48 formed in (see FIG. 12A).

Next, a silicon oxide film 72 is formed on the entire surface by, e.g., CVD to fill the element isolation grooves 48 with the silicon oxide film 72 (see FIG. 12C).

Then, the silicon oxide film 72 is polished by, e.g., CMP until the Si cap layer 56 in the active region 50 defined by the element isolation grooves 48 is exposed to be made flat. Thus, the element isolation grooves 48 are filled with the element isolation insulation film 60 of the silicon oxide film 72.

Then, in the same way as in the third embodiment, a gate electrode 66, a source/drain diffused layers 62a, 62b, etc. are formed.

Thus, the semiconductor device according to the present embodiment shown in FIG. 11 is fabricated.

A Fifth Embodiment

Figure 13:
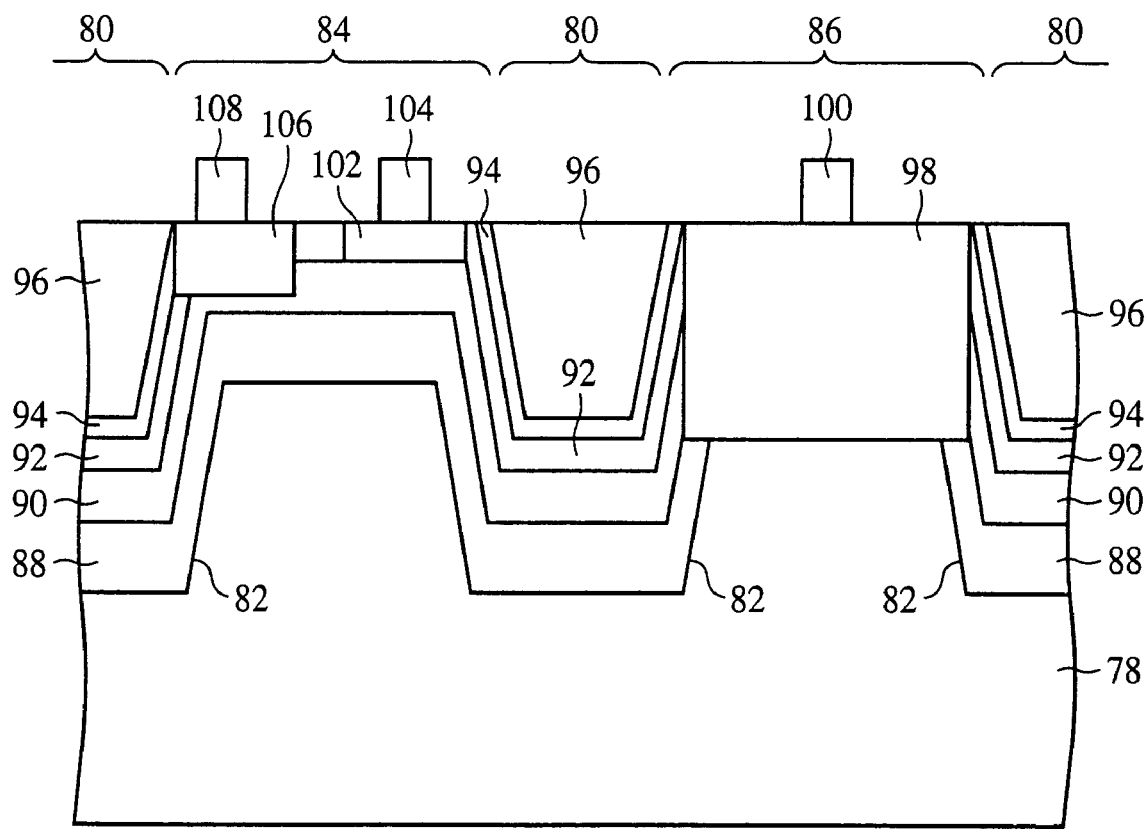
FIG. 13 is a sectional view of the semiconductor device according to a fifth embodiment of the present invention, which shows a structure thereof.

The semiconductor device according to a fifth embodiment of the present invention and the method for fabricating the semiconductor device will be explained with reference to FIGS. 13, 14A-14C, 15A-15C and 16A-16C. FIG. 13 is a sectional view of the semiconductor device according to the present embodiment, which shows a structure thereof. FIGS. 14A-14C, 15A-15C and 16A-16C are sectional views of the semiconductor device according to the present embodiment in the steps of the method for fabricating the semiconductor device, which show the method.

First, the semiconductor device according to the present embodiment will be explained with reference to FIG. 13. The semiconductor device according to the present embodiment is an npn type bipolar transistor including a p type strained SiGe layer which is compression-strained.

Element isolation insulation grooves 82 to be element isolation regions 80 are formed in an n type region 78 formed in a p type Si substrate to define an emitter base formed region 84 and a collector formed region 86.

On the entire surface of the n type region 78 with the element isolation grooves 82 formed in, a Si regrown buffer layer 88, a p type strained SiGe channel layer 90 and a non-doped Si emitter layer 92 are stacked.

A SiN film 94 is formed on the Si emitter layer 92 formed on the side walls and the bottom surfaces of the element isolation grooves 82. An element isolation insulation film 96 of a silicon oxide film is buried in the element isolation grooves 82 with the SiN film 94 formed in.

A collector electrode contact region 98 which is doped with phosphorus ions is formed in the n type region 78 of the p type Si substrate, the Si regrown buffer layer 88, the p type strained SiGe channel layer 90 and the Si emitter layer 92 in the collector formed region 86. A collector electrode 100 is formed on the collector electrode contact region 98.

An emitter electrode contact region 102 doped with phosphorus ions is formed in the Si emitter layer 92 in the emitter base formed region 84. An emitter electrode 104 is formed on the emitter electrode contact region 102.

A base electrode contact region 106 doped with boron ions is formed in the p type strained SiGe channel layer 90 and the Si emitter layer 92 in the emitter base formed region 84. A base electrode 108 is formed on the base electrode contact region 106.

The semiconductor device according to the present embodiment is characterized mainly in that the Si emitter layer 92 and the SiN film 94 are disposed between the SiGe layer and the element isolation insulation film 96 at the edges of the emitter base formed region 84 and the collector formed region 86 of the bipolar transistor structure including the strained semiconductor layer. The Si emitter layer 92 and the SiN film 94 prevent the contact between the SiGe layer and the element isolation insulation film 96 of a silicon oxide film, whereby the formation of the leak current paths along the edges of the emitter base formed region 84 and the collector formed region 86 can be suppressed. Accordingly, the bipolar transistor can have low electric power consumption and high operational speed.

Next, the method for fabricating the semiconductor device according to the present embodiment will be explained with reference to FIGS. 14A-14C, 15A-15C and 16A-16C.

First, phosphorus ions are implanted, through a resist mask, into the p type Si substrate doped with about $1\times10^{16}/$ cm$^3$ boron to form the n type region 78.

Figure 14A:
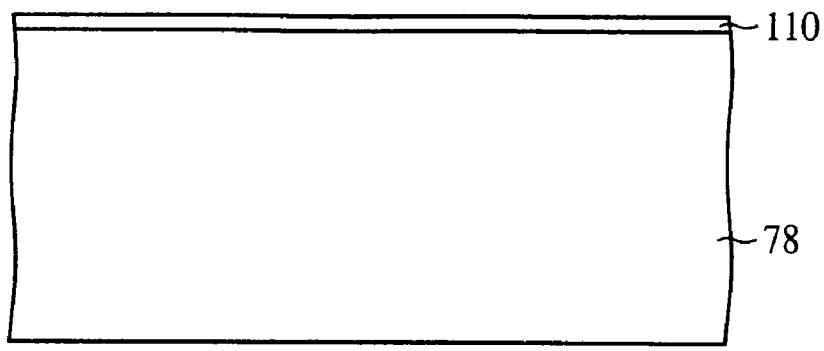
FIGS. 14A-14C are sectional views of the semiconductor device according to the fifth embodiment of the present invention in the steps of the method for fabricating the semiconductor device, which shows the method (Part 1).

Next, a 10 nm-thickness SiN film 110 is formed on the n type region 78 of the p type Si substrate by, e.g., CVD (see FIG. 14A)

Then, the SiN film 110 is patterned by lithography and etching to leave the SiN film 110 in regions which are to be the emitter base formed region 84 and the collector formed region 86.

Figure 14B:
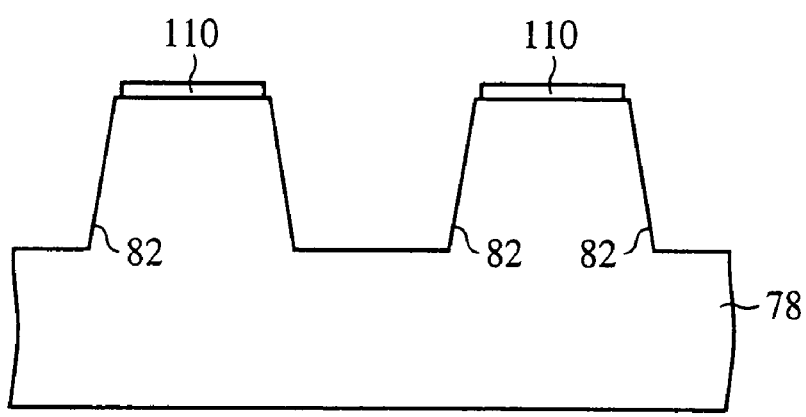

Next, the n type region 78 of the p type Si substrate is etched by, e.g., RIE with the SiN film 110 as a mask to form the element isolation grooves 82 (see FIG. 14B).

After the element isolation grooves 82 have been formed, the SiN film which has been used as the mask is etched off.

Figure 14C:
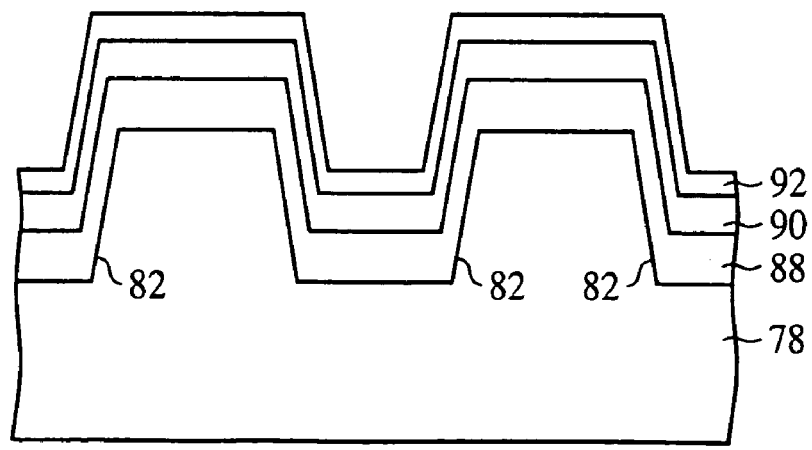

Then, the Si regrown buffer layer 88 of a 10 nm-thickness, the strained SiGe channel layer 90 of a 20 nm-thickness and a non-doped Si emitter layer 92 of a 20 nm-thickness are sequentially stacked by, e.g., MOCVD on the entire surface of the n type region 78 of the p type Si substrate with the element isolation grooves 82 formed in (see FIG. 14C).

Next, the SiN film 94 to be used as a stopper film for the polishing is formed on the entire surface by, e.g., MOCVD.

Figure 15A:
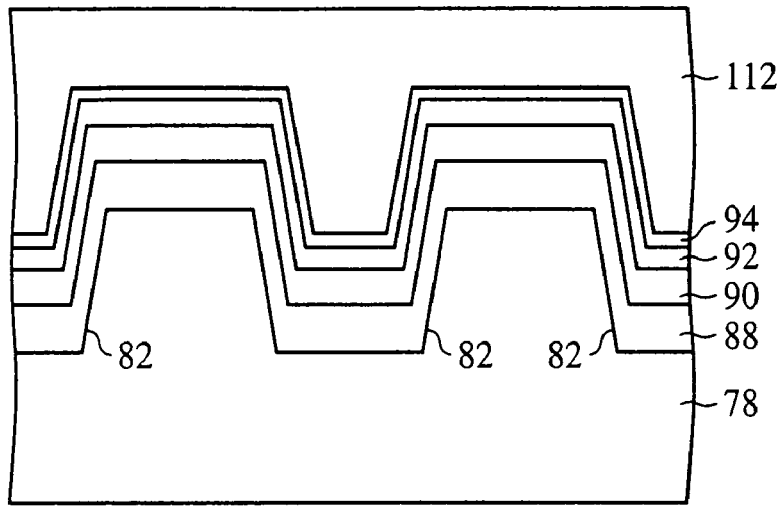
FIGS. 15A-15C are sectional views of the semiconductor device according to the fifth embodiment of the present invention in the steps of the method for fabricating the semiconductor device, which shows the method (Part 2).

Then, the silicon oxide film 112 is formed on the entire surface by, e.g., CVD to fill the element isolation grooves 82 with the silicon oxide film 112 (see FIG. 15A).

Then, the silicon oxide film 112 is polished down to the SiN film 94 as the stopper film by, e.g., CMP to be made flat. Thus, the element isolation grooves 82 are filled with the element isolation insulation film 96 of the silicon oxide film 112.

Figure 15B:
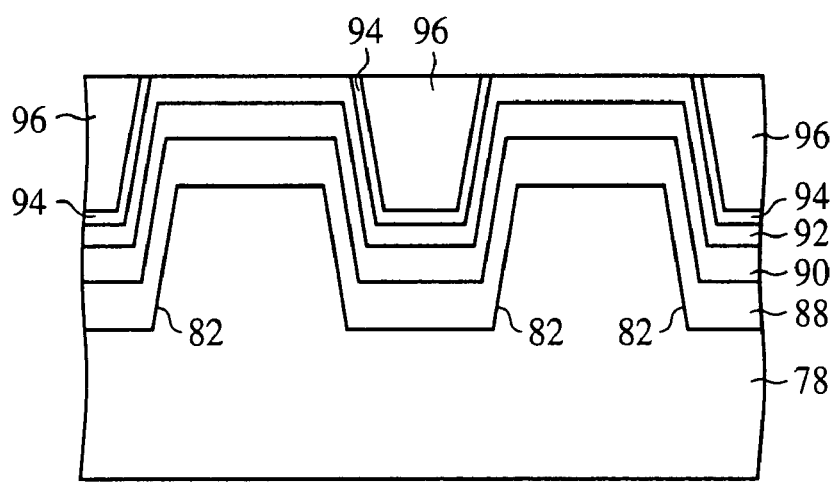

Next, the exposed SiN film 94 is removed by, e.g., thermal phosphatization (see FIG. 15B). At this time, the SiN film 94 between the Si emitter layer 92 and the element isolation insulation film 96 at the edge of the emitter base formed region 84 and the collector formed region 86 is not removed because the phosphoric acid does not enter there, as in the first embodiment.

Then, a resist film 114 is formed on the entire surface. Then, the resist film 114 is patterned in a shape which exposes the collector formed region 86 to be formed.

Figure 15C:
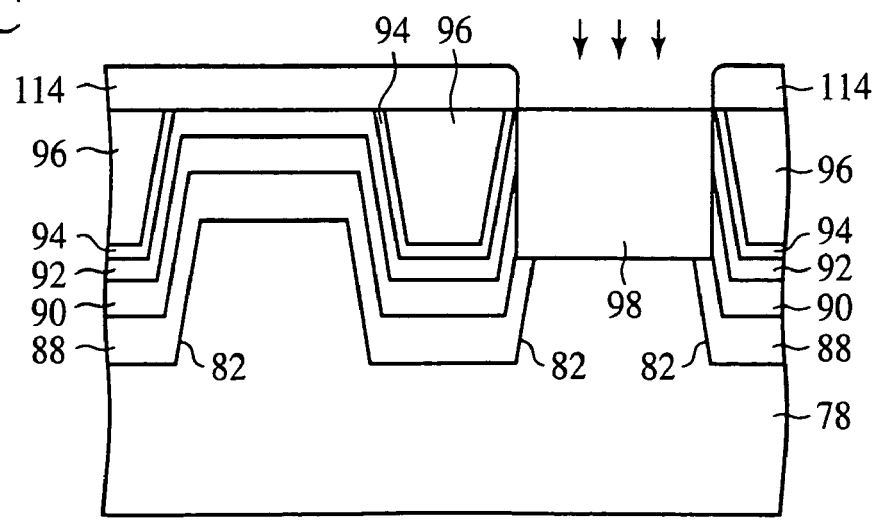

Then, phosphorus ions are implanted through the patterned resist film 114 to form the collector electrode contact region 98 (see FIG. 15C).

After the collector electrode contact region 98 has been formed, the resist film 114 used as the mask is removed.

Then, a resist film 116 is formed on the entire surface. Next, the resist film 116 is patterned in a shape which exposes that of the emitter base formed region 84 where the base electrode contact region 106 is to be formed.

Figure 16A:
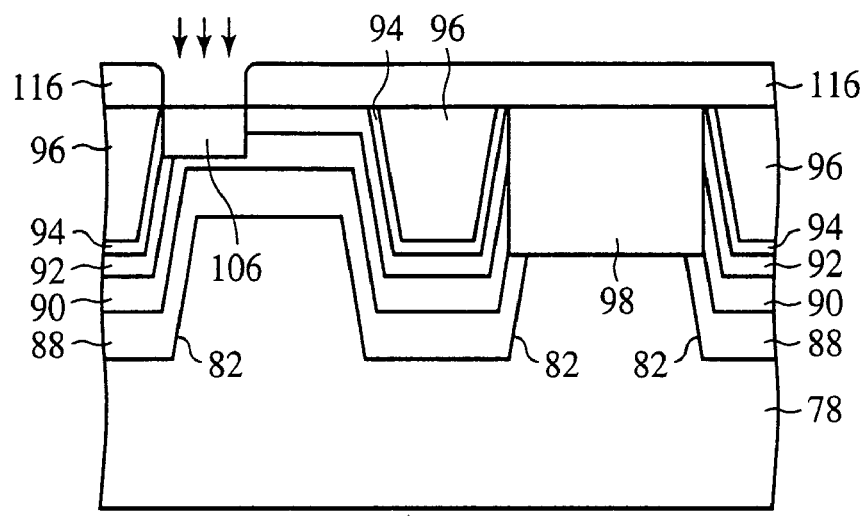
FIGS. 16A-16C are sectional views of the semiconductor device according to the fifth embodiment of the present invention in the steps of the method for fabricating the semiconductor device, which shows the method (Part 3).

Boron ions are implanted through the patterned resist film 116 to form the base electrode contact region 106 (see FIG. 16A).

After the base electrode contact region 106 has been formed, the resist film 116 used as the mask is removed.

Then, a resist film 118 is formed on the entire surface. Next, the resist film 118 is patterned in a shape which exposes that of the emitter base formed region 84 where the emitter electrode contact region 102 is to be formed.

Figure 16B:
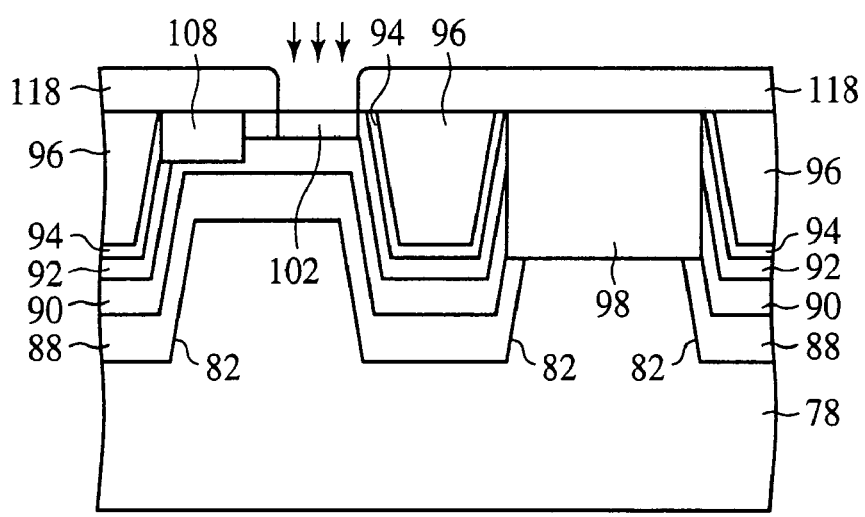
Figure 16C:
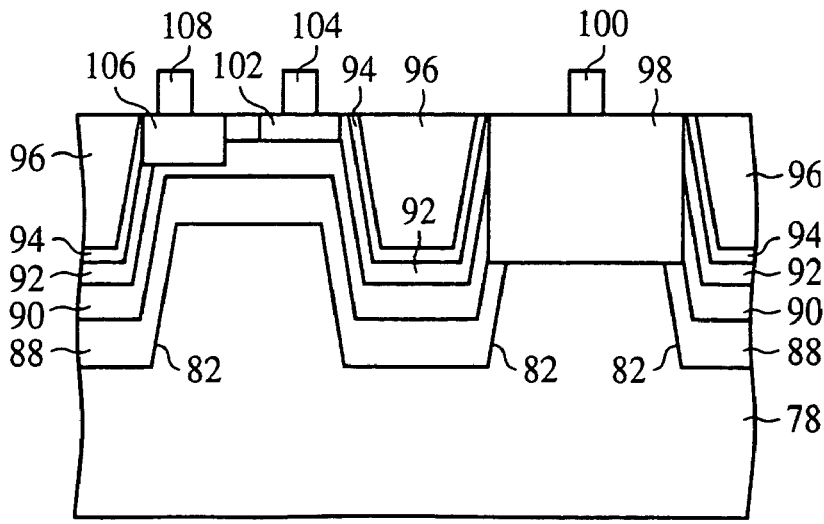

Next, phosphorus ions are implanted through the patterned resist film 118 to form the emitter electrode contact region 102 (see FIG. 16B).

After the emitter electrode contact region 102 has been formed, the resist film 118 used as the mask is removed.

Then, annealing is performed to activate the above-described ion-implanted regions.

Next, a metal film is formed on the entire surface. The metal film is patterned by lithography and etching to form the collector electrode 100, the emitter electrode 104 and the base electrode 108 respectively connected to the collector electrode contact region 98, the emitter electrode contact region 102 and the base electrode contact region 106 (see FIG. 16C).

Thus, the semiconductor device according to the present embodiment shown in FIG. 13 is fabricated.

As described above, according to the present embodiment, the Si emitter layer 92 and the SiN film 94 prevent the contact between the SiGe layer in the emitter base formed region 84 and the collector formed region 98 and the element isolation insulation layer 96, whereby the formation of the leak current paths along the edges of the emitter base formed region 84 and the collector formed region 96 can be suppressed. Accordingly, the bipolar transistor of low electric power consumption and high operational speed can be fabricated.

The bipolar transistor can be fabricated without adding fabrication steps, as of exposure, etc. even in comparison with the conventional bipolar transistors.

In the present embodiment, the bipolar transistor having the strained SiGe channel layer has been explained. However, the present invention is applicable to bipolar transistors having strained Si channel layers, as in the first embodiment.

The semiconductor device according to the present embodiment does not have to essentially include the SiN film 94 either, as do not the semiconductor device according to the second embodiment, which is the semiconductor device according to the first embodiment without the SiN film, and the semiconductor device according to the fourth embodiment, which is the semiconductor device according to the third embodiment without the SiN film.

Figure 17:
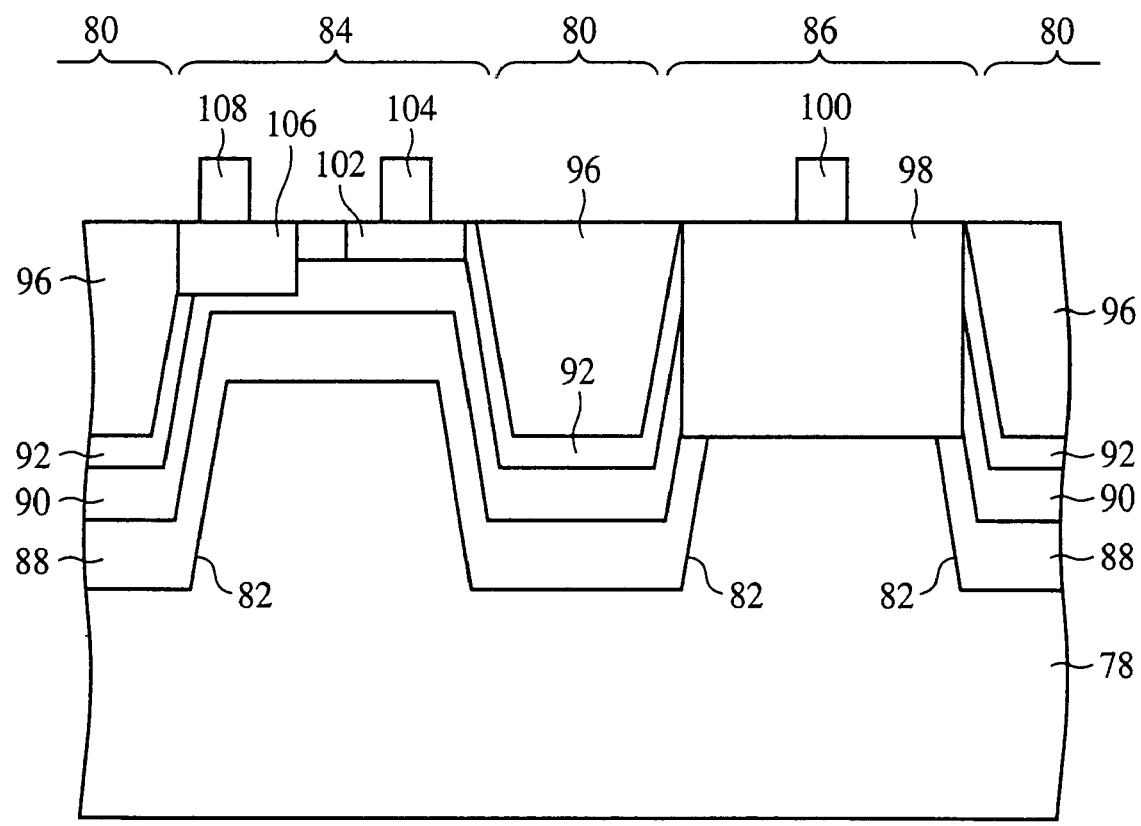
FIG. 17 is a sectional view of the semiconductor device according to a modification of the fifth embodiment of the present invention, which shows a structure thereof.

FIG. 17 is a sectional view of a structure of the semiconductor device according to the present embodiment, which does not include the SiN film 94. As shown, the element isolation insulation film 96 is buried directly in the element isolation grooves 82 with the Si emitter layer 92 formed on the side walls and the bottom surfaces.

As described above, even without the SiN film 94, the Si emitter layer 92 can prevent the contact between the SiGe layer in the emitter base formed region 84 and the collector formed region 86, and the element isolation insulation film 96. Accordingly, the formation of the leak current paths along the edges of the emitter base formed region 84 and the collector formed region 86 can be suppressed.

A Sixth Embodiment

Figure 18:
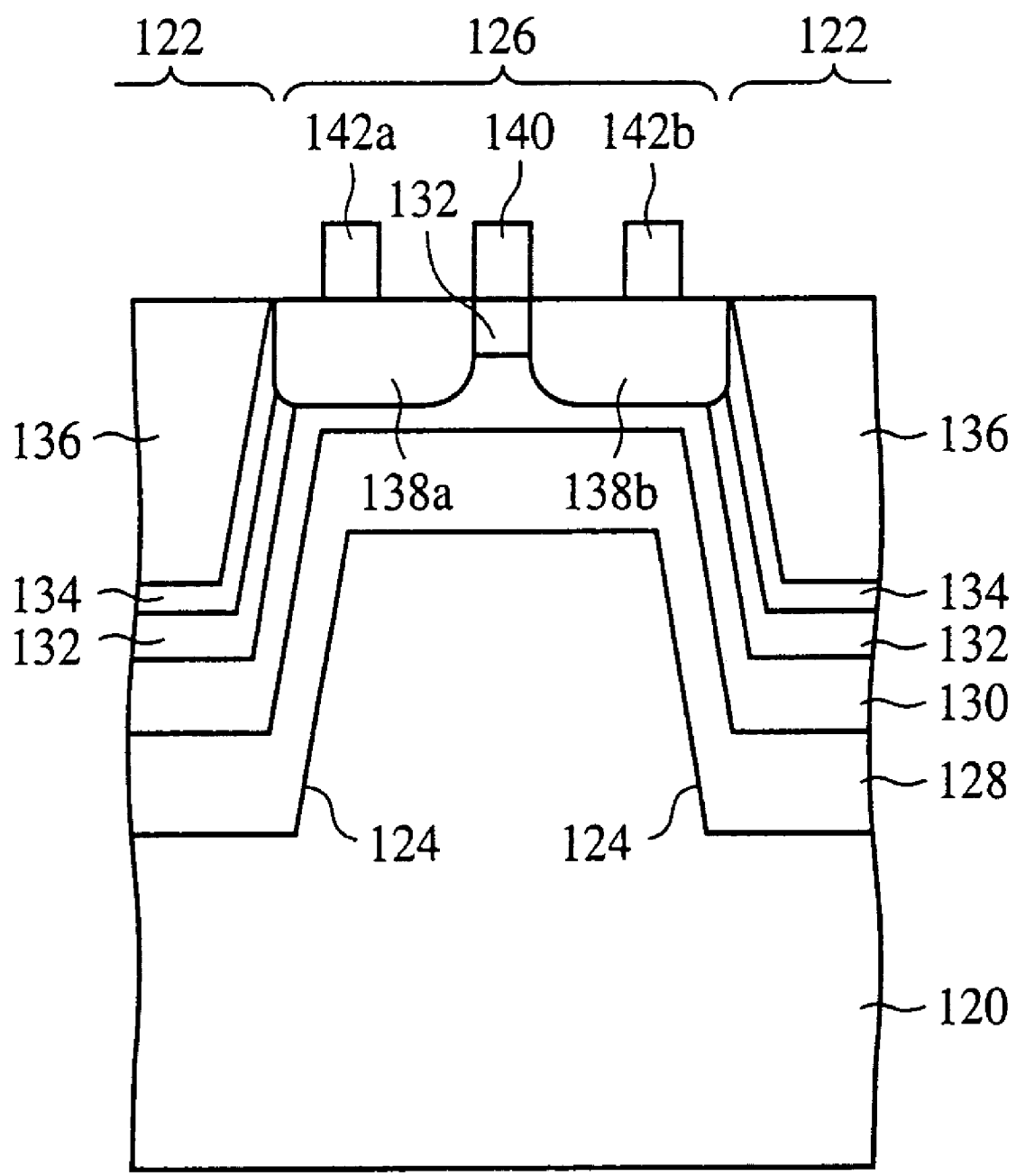
FIG. 18 is a sectional view of the semiconductor device according to a sixth embodiment of the present invention, which shows a structure thereof.

The semiconductor device according to a sixth embodiment of the present invention and the method for fabricating the semiconductor device will be explained with reference to FIGS. 18, 19A-19C, 20A-20C and 21A-21C. FIG. 18 is a sectional view of the semiconductor device according to the present embodiment, which shows a structure thereof. FIGS. 19A-19C, 20A-20C and 21A-21C are sectional views of the semiconductor device in the steps of the method for fabricating the semiconductor device, which explain the method.

First, the semiconductor device according to the present embodiment will be explained with reference to FIG. 18. The semiconductor device according to the present embodiment is a HEMT (High Electron Mobility Transistor) having a strained SiGe channel layer which is compression-strained.

Element isolation grooves 124 to be element isolation regions 122 are formed in an n type Si substrate 120 doped with boron and having a high resistance as high as about hundreds Ωcm, and the element isolation grooves 124 define an active region 126 where an element is formed.

A Si regrown buffer layer 128, a non-doped strained SiGe channel layer 130 and a p type Si hole supply layer 132 which supplies to the strained SiGe channel layer 130 holes to be carriers are sequentially stacked on the n type Si substrate 120 with the element isolation grooves 124 formed in.

A SiN film 134 is formed on the Si hole supply layer 132 formed on the side walls and the bottom surfaces of the element isolation grooves 124. An element isolation insulation film 136 of silicon oxide film is buried in the element isolation grooves 124 with the SiN film 134 formed in.

Source/drain diffused layers 138a, 138b are formed in the Si hole supply layer 132 and the strained SiGe channel layer 130 in the active region 126. A gate electrode 140 is formed on the Si hole supply layer 132 between the source/drain diffused layers 138a, 138b. Source/drain electrodes 142a, 142b are electrically connected to the source/drain diffused layers 138a, 138b. Thus, the transistor having the gate electrode 140 and the source/drain diffused layers 138a, 138b in the active region 126 is constituted.

The semiconductor device according to the present embodiment is characterized mainly in that the Si hole supply layer 132 and the SiN layer 134 are formed between the SiGe layer and the element isolation insulation film 136 at the edges of the active region 126 of a transistor structure having the strained semiconductor layer to be the channel. The Si hole supply layer 132 and the SiN film 134 prevent the contact between the SiGe layer and the element isolation insulation film 136 of silicon oxide film, whereby the formation of the leak current paths along the edges of the active region 126 can be suppressed. Accordingly, the HEMT can have low electric power consumption and high operational speed.

Then, the method for fabricating the semiconductor device according to the present embodiment will be explained with reference to FIGS. 19A-19C, 20A-20C and 21A-21C.

Figure 19A:
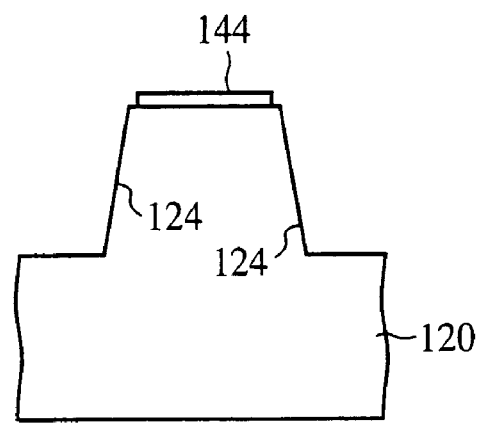
FIGS. 19A-19C are sectional views of the semiconductor device according to the sixth embodiment of the present invention in the steps of the method for fabricating the semiconductor device, which shows the method (Part 1).

First, in the same way as in the third embodiment, the SiN film 144 formed on the n type Si substrate 120 is patterned, and etching with the patterned SiN film 144 as a mask forms the element isolation grooves 124 in the n type Si substrate 120 (see FIG. 19A).

After the element isolation grooves 124 have been formed, the SiN film used as the mask is etched off.

Figure 19B:
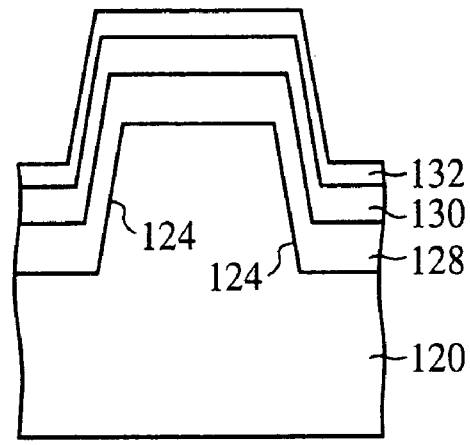

Then, the Si regrown buffer layer 128 of a 10 nm-thickness and the non-doped strained SiGe channel layer 130 of a 10 nm-thickness, and the Si hole supply layer 132 having a 20 nm-thickness and doped with a p type dopant, such as boron or others are sequentially stacked by, e.g., MOCVD on the entire surface of the n type Si substrate 120 with the element isolation grooves 124 formed in (see FIG. 19B).

Next, the SiN film 134 to be used as a stopper film for the polishing is formed on the entire surface by, e.g., MOCVD.

Figure 19C:
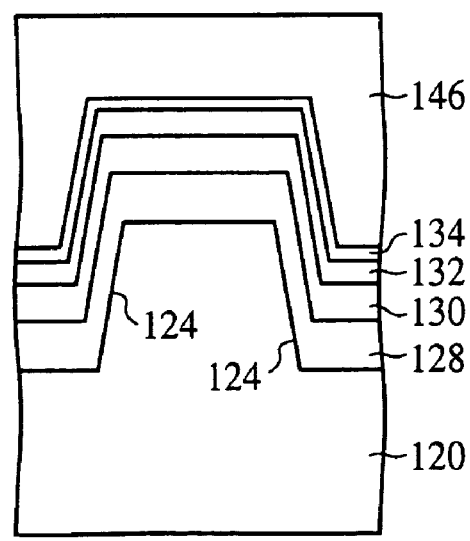

Next, the silicon oxide film 146 is formed on the entire surface by, e.g., CVD to fill the element isolation grooves 124 with the silicon oxide film 146 (see FIG. 19C).

Then, the silicon oxide film 146 is polished by, e.g., CMP down to the SiN film 134 as the stopper film to be made flat. Thus, the element isolation grooves 124 are filled with the element isolation insulation film 136 of the silicon oxide film 146.

Figure 20A:
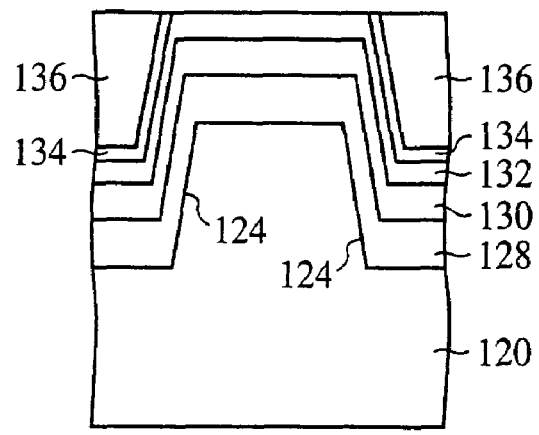
FIGS. 20A-20C are sectional views of the semiconductor device according to the sixth embodiment of the present invention in the steps of the method for fabricating the semiconductor device, which shows the method (Part 2).
Figure 20B:
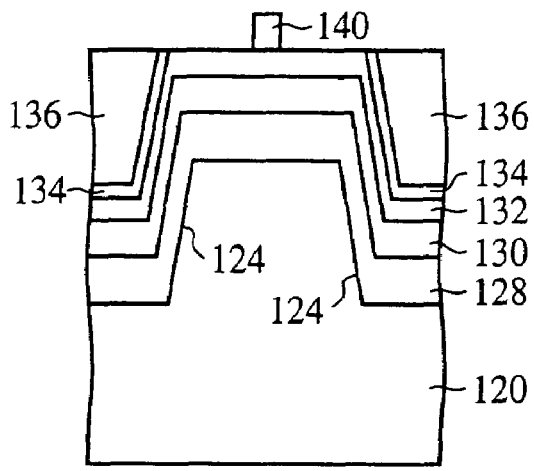

Next, the exposed SiN film 134 is removed by, e.g., thermal phosphatization (see FIG. 20A). The SiN film 134 between the Si hole supply layer 132 at the edges of the active region 126 and the element isolation insulation film 136 is not removed because the hot phosphoric acid does not enter there, as in the first embodiment.

Then, a metal film is formed on the Si hole supply layer 132 in the active region 126 by, e.g., CVD. Then, the metal film is patterned to form the gate electrode 140 (see FIG. 20B).

Figure 20C:
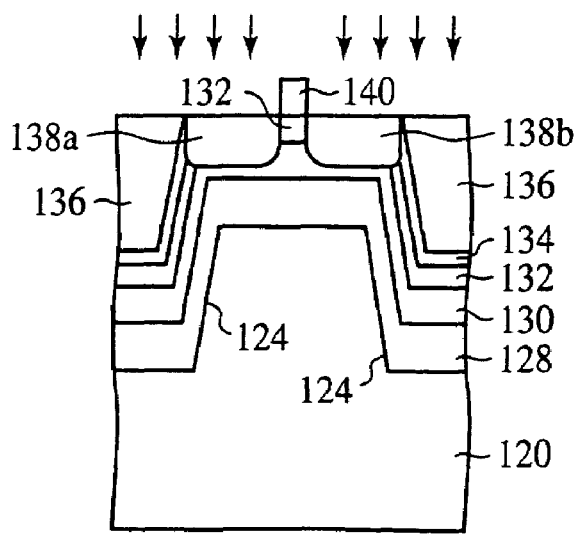

Next, with the gate electrode 140 as a mask, phosphorus ions are implanted to form the source/drain diffused layers 138a, 138b in the Si hole supply layer 132 on both sides of the gate electrode 140 (see FIG. 20C).

Then, the source/drain electrodes 142a, 142b are formed, electrically connected to the source/drain diffused layers 62a, 62b.

Thus, the semiconductor device according to the present embodiment shown in FIG. 18 is fabricated.

As described above, according to the present embodiment, the Si hole supply layer 132 and the SiN film 134 prevent the contact between the SiGe layer and the element isolation insulation film 136 of silicon oxide film, whereby the formation of the leak current paths along the edges of the active region 126 can be suppressed. Accordingly, the HEMT can have low electric power consumption and high operational speed.

The HEMT can be fabricated without adding fabrication steps, as of exposure, etc. even in comparison with the conventional HEMTs.

The semiconductor device according to the present embodiment does not have to essentially include the SiN film 134 either, as do not the semiconductor device according to the second embodiment, which is the semiconductor device according to the first embodiment without the SiN film, and the semiconductor device according to the fourth embodiment, which is the semiconductor device according to the third embodiment without the SiN film.

Figure 21:
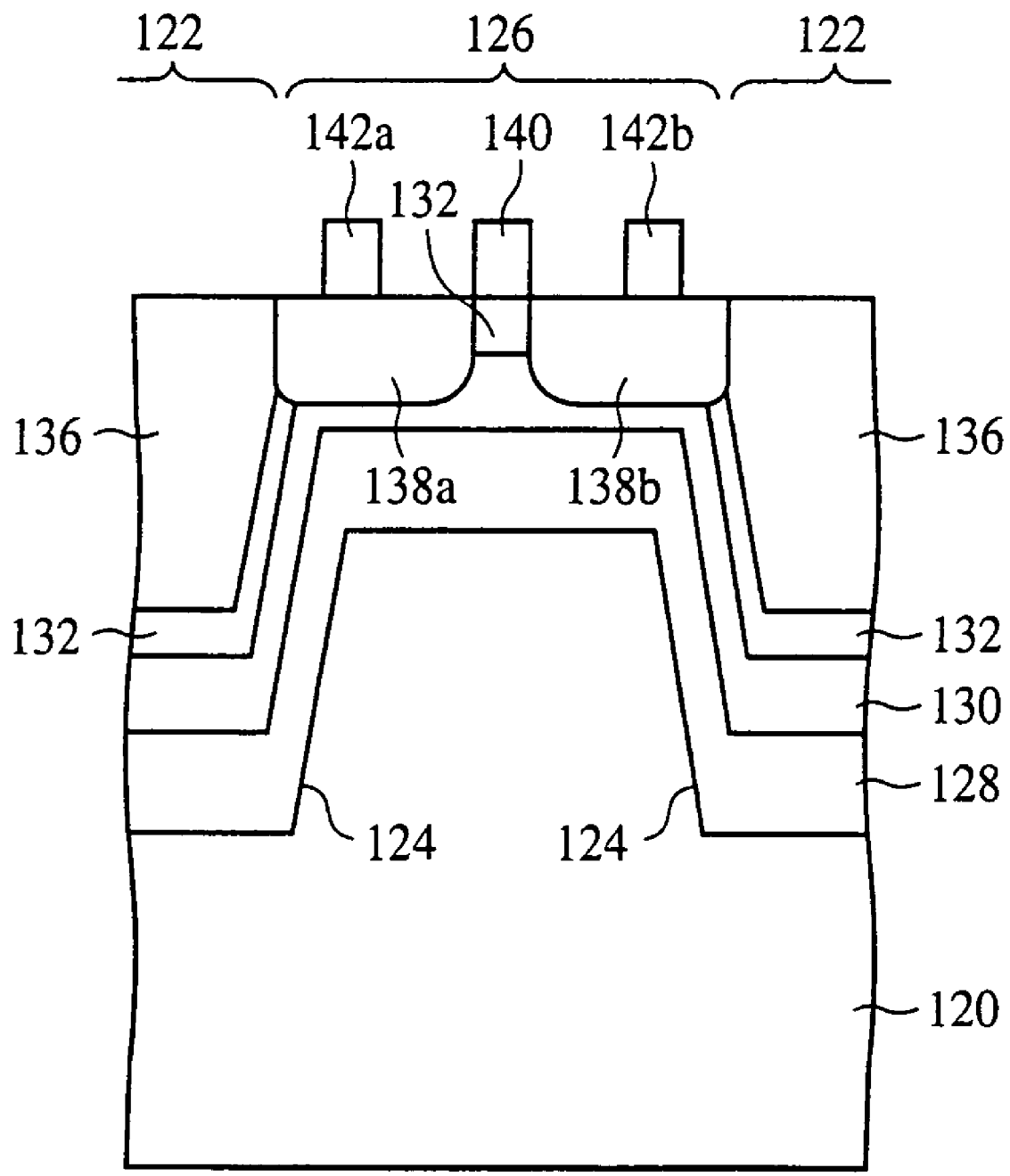
FIG. 21 is a sectional view of the semiconductor device according to a modification of the sixth embodiment of the present invention, which shows a structure thereof
Figure 22:
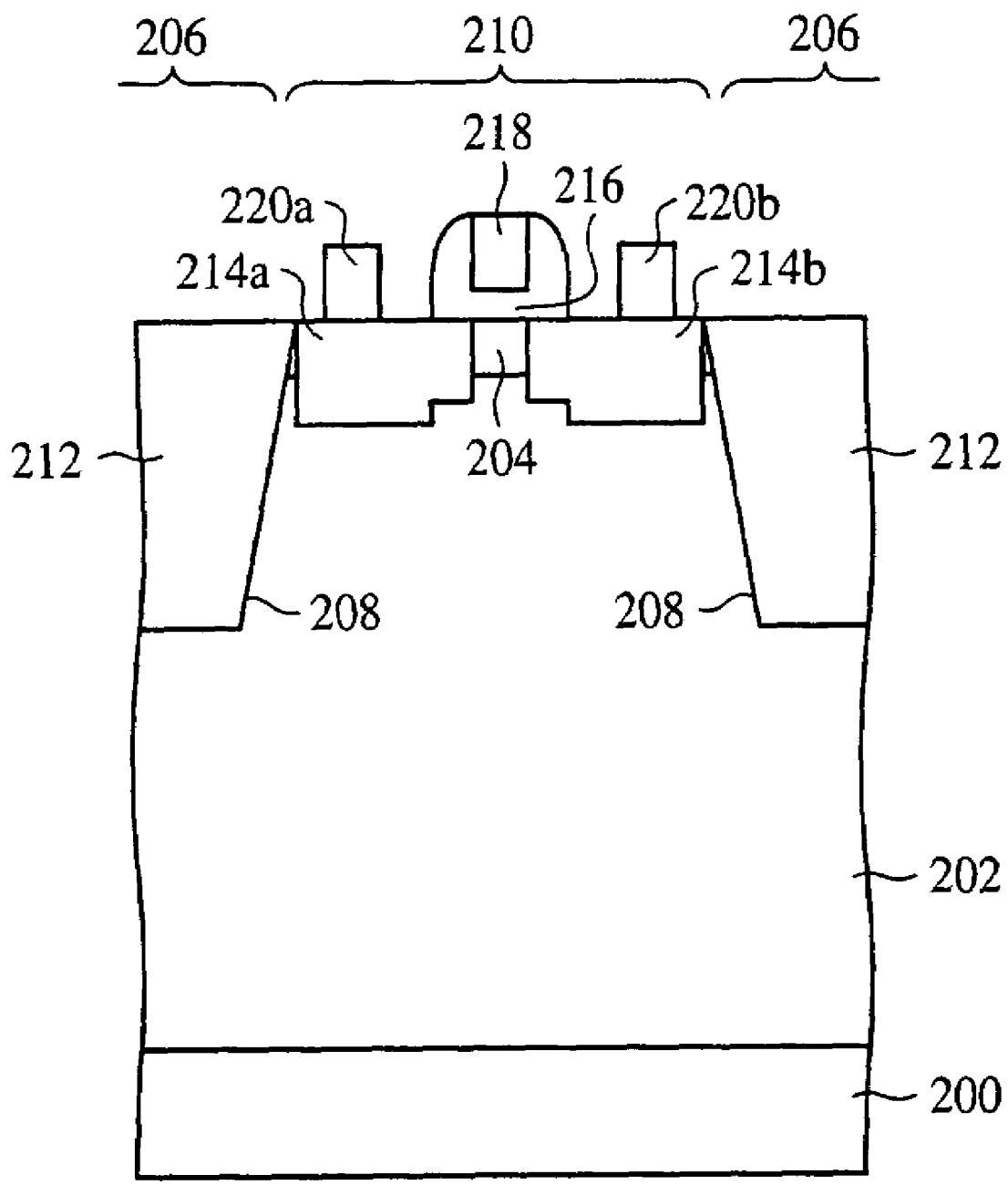
FIG. 22 is a sectional view of a conventional MOS transistor having the semiconductor layer to be the channel strained, which shows the structure thereof (Part 1).
Figure 23:
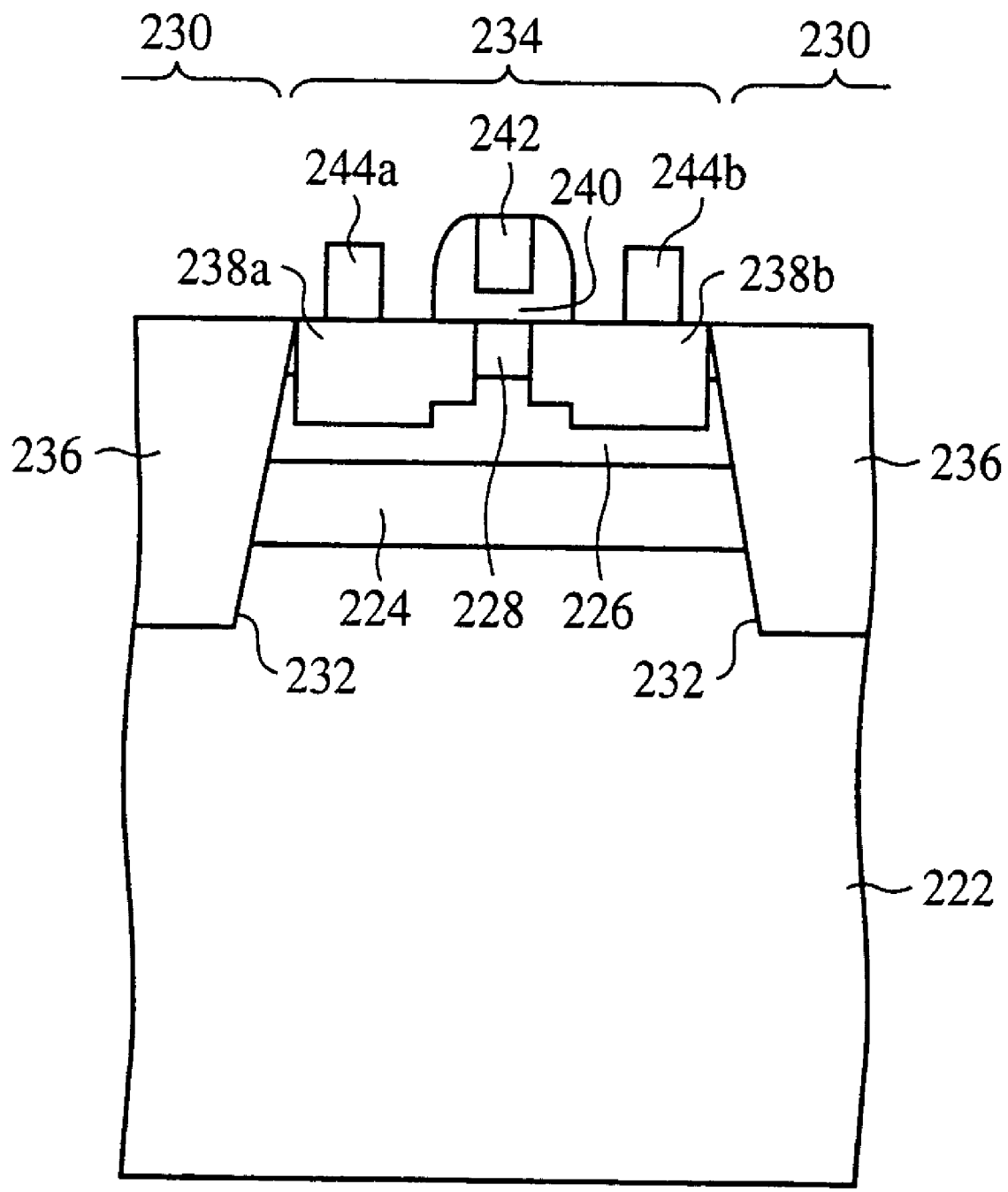
FIG. 23 is a sectional view of a conventional MOS transistor having the semiconductor layer to be the channel strained, which shows the structure thereof (Part 2).
Figure 24:
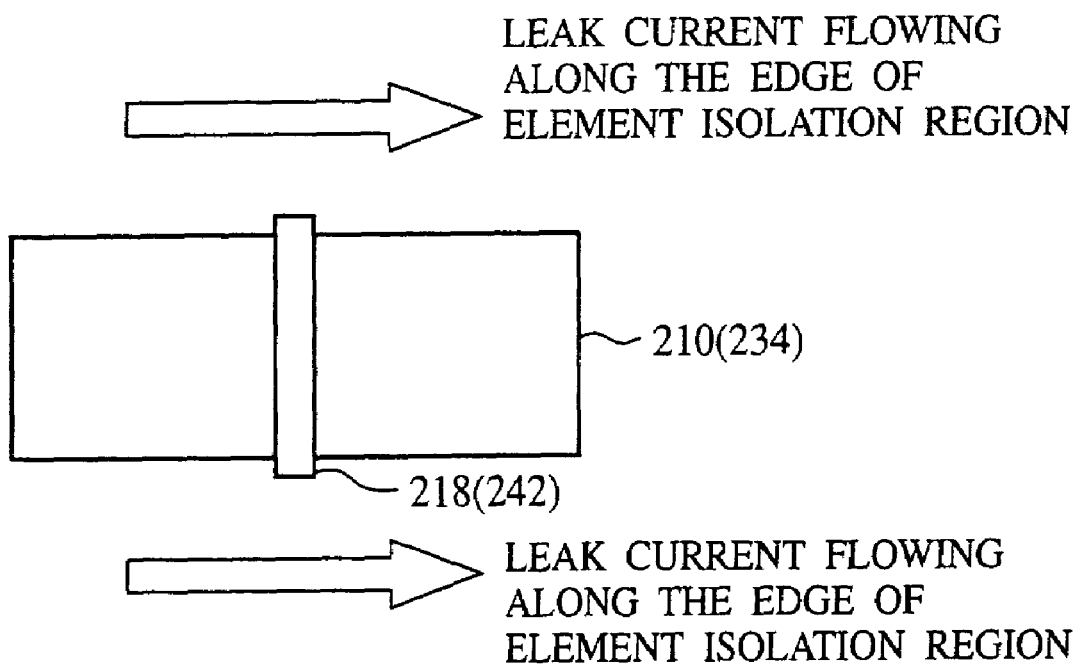
FIG. 24 is an upper side view of the active regions of the conventional MOS transistors having the semiconductor layer to be the channel strained, which shows leak current paths formed along the ends of the active regions.
Figure 25:
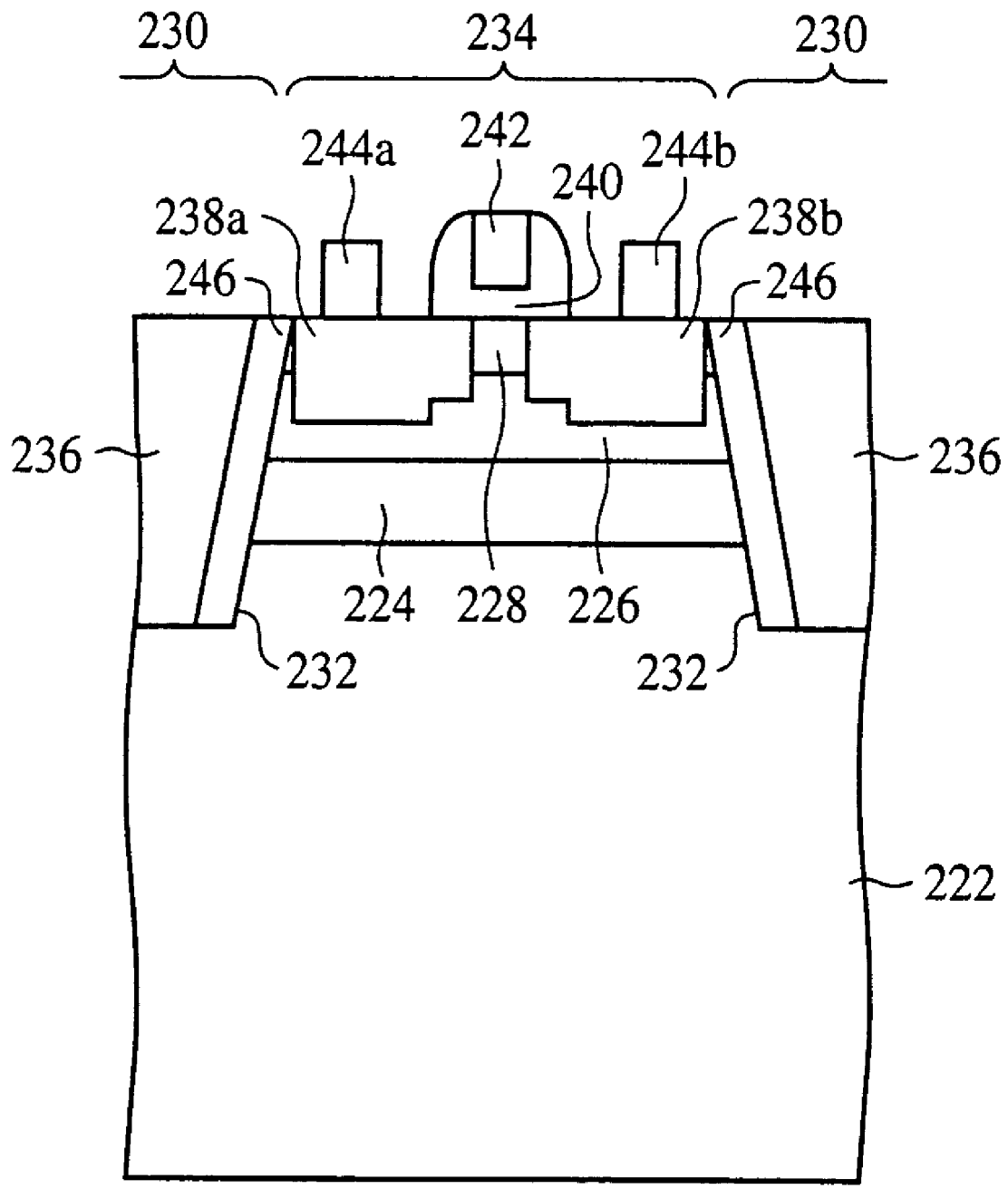
FIG. 25 is a sectional view of the conventional MOS transistor having the strained semiconductor layer to be the channel, which has a sidewall of polysilicon formed on the ends of the active region.

FIG. 21 is a sectional view of the semiconductor device according to the present embodiment which does not include the SiN film 134, which shows a structure thereof. As shown, the element isolation insulation film 136 is buried directly in the element isolation grooves 124 with the Si hole supplying layer 132 formed on the side wall and the bottom surfaces.

As described above, even without the SiN film 134, the Si hole supplying layer 132 prevents the contact between the SiGe layer in the active region 126 and the element isolation insulation film 136. Accordingly, the formation of the leak current paths along the edges of the active region 126 can be suppressed.

Modified Embodiments

The present invention is not limited to the above-described embodiments and can cover other various modifications.

For example, in the above-described embodiments, the p type MOS transistor, the npn type bipolar transistor, etc. have been explained. The present invention is applicable to an n type MOS transistor, a pnp type transistor, etc. whose conduction types are opposite to those described in the above-described embodiments.

In the above-described embodiments, in order to prevent the contact between the SiGe layer in the active region, etc. and the element isolation insulation film, the SiN film is disposed therebetween, but a film disposed therebetween is not limited to SiN film. In place of SiN film, SiON film, for example, may be disposed therebetween. In using the SiON film, in place of forming the SiN film by CVD, after a Si layer, such as the strained Si channel layer, the Si cap layer or others, has been formed, a thermal oxide film of the Si layer is formed. Then, the thermal oxide film is nitrified to form the SiON film. However, in this case, a Si layer, such as the strained Si channel layer, the Si cap layer or others, as a base for forming the SiON film is consumed by the thermal oxidation. Accordingly, it is preferable to form the strained Si channel layer, the Si cap layer, or others in a thickness which allows for an amount to be consumed by the thermal oxidation.

In the above-described embodiments, the SiGe regrown buffer layer is formed on the SiGe buffer layer with the element isolation grooves formed in, and the Si regrown buffer layer is formed on the p type Si substrate with the element isolation grooves formed in. However, the SiGe regrown layer or the Si regrown buffer layer is not essentially formed. In the above-described embodiments, the SiGe regrown buffer layer or the Si regrown buffer layer is grown for the following reason. That is, in forming layers forming a semiconductor device by CVD, a substrate is pre-treated in air and is loaded in a processing furnace. Accordingly, contaminants remain in the regrown interface, which is one cause for deviations of transistor characteristics. The regrown buffer layer is formed as in the above-described embodiments, whereby the transistor characteristics are kept from being affected by such contaminants.

What is claimed is:

1. A method for fabricating a semiconductor device comprising the steps of:
   forming a SiGe layer on a silicon substrate;
   forming a silicon layer on the SiGe layer;
   forming a mask layer over the silicon layer;
   forming in the SiGe layer and the silicon layer an element isolation groove for defining an active region by using the mask layer as a mask;
   removing the mask layer;
   after removing the mask layer, forming a strained silicon layer on the side wall of the element isolation groove and the silicon layer in the active region; and
   burying an element isolation insulation film in the element isolation groove with the strained silicon layer formed in.

2. The method for fabricating a semiconductor device according to claim 1, further comprising, prior to the step of burying the element isolation insulation film in the element isolation groove, the step of:
   forming an insulation film on the strained silicon layer.

3. The method for fabricating a semiconductor device according to claim 2, wherein
   in the step of forming the insulation film, a SiN film is formed as the insulation film.

4. The method for fabricating a semiconductor device according to claim 3, further comprising, prior to the step of forming the insulation film, the step of:
   oxidizing the strained silicon layer to form a silicon oxide film on the surface of the strained silicon layer.

5. The method for fabricating a semiconductor device according to claim 2, wherein
   in the step of forming the insulation film, the strained silicon layer is oxidized and nitrified to form a SiON film as the insulation film.

6. The method for fabricating a semiconductor device according to claim 1, wherein the step of forming the element isolation groove in the SiGe layer and the silicon layer comprises the steps of:
   oxidizing the silicon layer to form a silicon oxide film on the surface of the silicon layer;
   forming a SiN film on the silicon oxide film; and
   forming the element isolation groove in the SiGe layer and the silicon layer by etching through the SiN film.

7. A method for fabricating a semiconductor device comprising the steps of:
   forming in a silicon substrate an element isolation groove for defining an active region;
   forming a SiGe layer on the side wall of the element isolation groove and the active region in the silicon substrate;

forming a silicon layer on the SiGe layer; and burying an element isolation insulation film in the element isolation groove with the silicon layer formed in.

8. The method for fabricating a semiconductor device according to claim 7, further comprising, prior to the step of burying the element isolation film in the element isolation grooves, the step of:

forming an insulation film on the silicon layer.

9. The method for fabricating a semiconductor device according to claim 8, wherein, in the step of forming the insulation film, a SiN film is formed as the insulation film.

10. The method for fabricating a semiconductor device according to claim 9, further comprising, prior to the step of forming the insulation film, the step of:

oxidizing the silicon layer to form a silicon oxide film on the surface of the silicon layer.

11. The method for fabricating a semiconductor device according to claim 8, wherein in the step of forming the insulation film, the silicon layer is oxidized and nitrified to form a SiON film as the insulation film.

12. A method for fabricating a semiconductor device comprising the steps of:

forming a SiGe layer on a silicon substrate;

forming a silicon layer on the SiGe layer;

forming a mask layer over the silicon layer;

forming in the SiGe layer and the silicon layer an element isolation groove for defining an active region by using the mask layer as a mask;

removing the mask layer;

after removing the mask layer, forming a strained silicon layer on the side wall of the element isolation groove and the silicon layer in the active region;

burying an element isolation insulation film in the element isolation groove with the strained silicon layer formed in; and forming a MOS transistor on the strained silicon layer.

13. The method for fabricating a semiconductor device according to claim 12, further comprising, prior to the step of burying the element isolation insulation film in the element isolation groove, the step of:

forming an insulation film on the strained silicon layer.

14. The method for fabricating a semiconductor device according to claim 13, wherein in the step of forming the insulation film, a SiN film is formed as the insulation film.

15. The method for fabricating a semiconductor device according to claim 14, further comprising, prior to the step of forming the insulation film, the step of:

oxidizing the strained silicon layer to form a silicon oxide film on the surface of the strained silicon layer.

16. The method for fabricating a semiconductor device according to claim 13, wherein in the step of forming the insulation film, the strained silicon layer is oxidized and nitrified to form a SiON film as the insulation film.

17. The method for fabricating a semiconductor device according to claim 12, wherein the step of forming the element isolation groove in the SiGe layer and the silicon layer comprises the steps of: oxidizing the silicon layer to form a silicon oxide film on the surface of the silicon layer; forming a SiN film on the silicon oxide film; and forming the element isolation groove in the SiGe layer and the silicon layer by etching through the SiN film.

* * * * *